US 6,570,645 B2

(12) United States Patent
Korenaga et al.

(10) Patent No.: US 6,570,645 B2
(45) Date of Patent: *May 27, 2003

(54) STAGE SYSTEM AND STAGE DRIVING METHOD FOR USE IN EXPOSURE APPARATUS

(75) Inventors: Nobushige Korenaga, Utsunomiya (JP); Ryuichi Ebinuma, Tokyo (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 15 days.

(21) Appl. No.: 09/359,911

(22) Filed: Jul. 26, 1999

(65) Prior Publication Data

US 2002/0145721 A1 Oct. 10, 2002

(30) Foreign Application Priority Data

Jul. 29, 1998 (JP) .......................................... 10-214094
Jul. 12, 1999 (JP) .......................................... 11-197470

(51) Int. Cl.$^7$ ........................ G03B 27/62; G03B 27/42; G03B 27/32; G03B 21/14; A61N 5/00
(52) U.S. Cl. .............................. 355/75; 355/53; 355/72; 355/77; 399/78; 250/492.2; 250/492.22
(58) Field of Search .............................. 355/75, 53, 72, 355/77; 399/78; 250/492.2, 492.22

(56) References Cited

U.S. PATENT DOCUMENTS

| 3,736,880 | A | * | 6/1973 | Ross ........................ 104/148 |
| 4,742,286 | A | * | 5/1988 | Phillips ...................... 318/640 |
| 4,999,506 | A | | 3/1991 | Mizusawa et al. ....... 250/491.1 |
| 5,073,912 | A | * | 12/1991 | Kobayashi et al. ........... 378/34 |
| 5,150,391 | A | | 9/1992 | Ebinuma et al. .............. 378/34 |
| 5,208,497 | A | * | 5/1993 | Ishii et al. ..................... 310/12 |
| 5,467,720 | A | | 11/1995 | Korenaga et al. ............. 108/20 |
| 5,504,407 | A | * | 4/1996 | Wakui et al. ................ 318/592 |
| 5,684,856 | A | * | 11/1997 | Itoh et al. ...................... 378/34 |
| 5,687,947 | A | * | 11/1997 | Iwamoto et al. |
| 5,699,145 | A | * | 12/1997 | Makinouchi et al. |
| 5,793,052 | A | * | 8/1998 | Kawaguchi |
| 5,841,250 | A | | 11/1998 | Korenage et al. ........... 318/135 |
| 5,940,789 | A | * | 8/1999 | Yuan |
| 6,008,610 | A | * | 12/1999 | Yuan et al. |

FOREIGN PATENT DOCUMENTS

JP 7-183192 7/1995

* cited by examiner

Primary Examiner—Russell Adams
Assistant Examiner—Khaled Brown
(74) Attorney, Agent, or Firm—Fitzpatrick, Cella, Harper & Scinto

(57) ABSTRACT

A stage system includes a stage being movable in a predetermined direction, a first unit for applying a force to the stage in the predetermined direction, a moving mechanism for moving one of the first unit and a structure including the first unit, a first measuring system for measuring at least one of the position and movement amount of the stage, and a second measuring system for measuring at least one of the position and movement amount of one of the first unit and the structure, wherein the stage is controlled on the basis of a measured value of the first measuring system, and wherein the moving system is controlled on the basis of a measured value of the second measuring system.

86 Claims, 18 Drawing Sheets

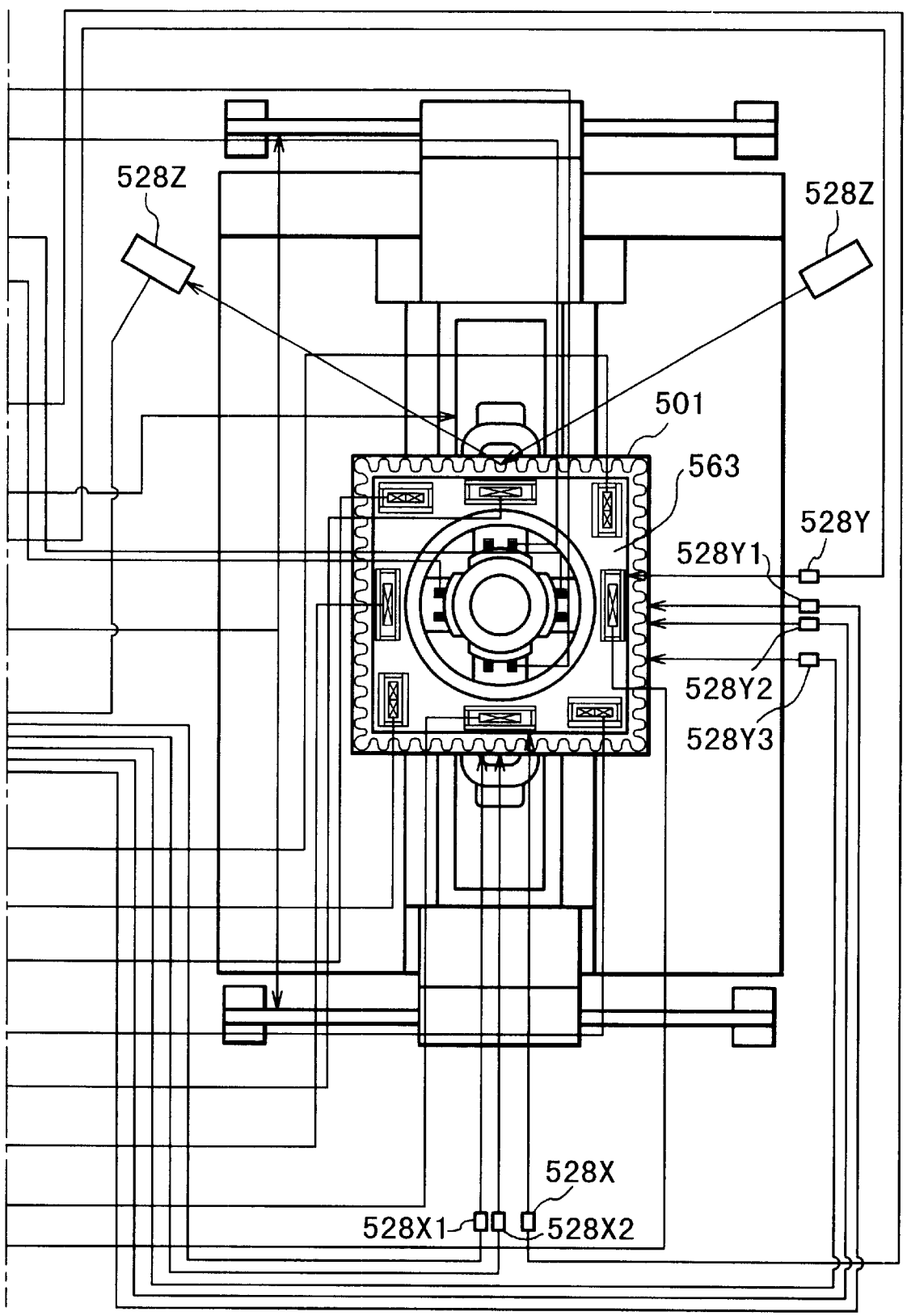
F I G. 11B

STAGE SYSTEM AND STAGE DRIVING METHOD FOR USE IN EXPOSURE APPARATUS

FIELD OF THE INVENTION AND RELATED ART

This invention relates generally to a stage system in which high precision positioning performance is required. The invention relates also to an exposure apparatus having such stage system for carrying a reticle or a wafer thereon for exposure of the same, and to a device manufacturing method using such exposure apparatus. In another aspect, the invention relates to a stage driving method effective to perform high precision positioning.

FIGS. 15A and 15B are schematic views of an example of known type stage system. A guide 802 is fixed to a base (not shown), and a stage 801 for carrying a workpiece 800 thereon is supported by the guide 802 slidably along one axial direction relative to it. There are linear motor moving elements 804 fixed at the opposite sides of the stage 801. Each moving element 804 faces to a linear motor stator 805 without contact thereto. The linear motor stators 805 are fixed to the base, not shown. Each linear motor moving element 804 comprises upper and lower integral structures of four-pole magnets 804a and yokes 804b for circulation of magnetic fluxes of the magnets. Each linear motor stator 805 comprises a plurality of coils 805a (six in this example) disposed in an array and being fixed together by a stator frame 805b.

The linear motor 803 described above is an extended type of ordinary brushless DC motor, wherein the driving coil and the direction of electric current thereto are changed in accordance with the relative positional relationship between the magnet 804a and the coil 805a, whereby a desired force is produced in a desired direction.

In the structure described above, first, while the stage 801 is held stationary, an electric current is applied to predetermined linear motor coils in a predetermined direction and for a predetermined time period in accordance with the position of the stage 801 or of the magnets 804a, to produce acceleration of the stage 801. When a desired speed is reached, acceleration is finished and, while constant speed control is kept, a predetermined operation such as exposure or inspection, for example, is performed. After the constant speed period, an electric current is applied to predetermined linear motor coils in a predetermined direction and for a predetermined time period, to cause deceleration of the stage and to stop the stage motion.

The position of the stage is measured by using high precision position sensor means (not shown) such as a laser interferometer, for example, and an electric current is applied to linear motor coils separately from acceleration or deceleration, so as to avoid an error with respect to a target position. Thus, even during acceleration period, deceleration period and constant speed period, high precision position control is performed.

FIG. 16 is a schematic view of another example of known type stage system. This stage system is similar to one disclosed in Japanese Laid-Open Patent Application, Laid-Open No. 183192/1995. A guide 909 is mounted on a base 903, and a stage 907 is supported slidably relative to the guide 909. The base 903 is provided with an actuator unit 901 which serves to perform the positioning through expansion and contraction of its rod 905. Disposed between an end of the rod 905 and the stage 907 are a voice coil motor 906 and a clutch 904. The motor 906 comprises a coil-and-magnet structure (not shown), and a Lorentz force is produced in response to application of electric current to the coil, whereby a driving force is produced between the rod 905 and the stage 907.

In the structure described above, for driving the stage, first the clutch 904 is engaged through mechanical contact so that the rod 905 and the stage are held in connection. The driving force of the actuator unit 901 is thus transmitted to the stage, whereby rough motion of the stage is produced. The clutch 904 is disengaged after the stage rough motion, and the stage 907 is driven thereafter relative to the rod 905 with the driving force of the voice coil motor 906, to accomplish the positioning of the stage 907.

Since there is clutch 904 in parallel to voice coil motor 906, it does not need operation of the motor 906 for long-stroke stage driving with the actuator unit 901. Heat generation of the motor 906 is thus reduced.

When a stage is moved by using a linear motor only as in the first example described above, high precision positioning control is accomplished constantly. However, there is large heat generation in stage acceleration and deceleration. Also, the heat source is close to the workpiece. Further, since in a multi-phase linear motor such as described above the electric current is applied while changing the coils, it is difficult to cool the linear motor stator as a whole. For these reasons, some components adjacent to the workpiece may be deformed by thermal expansion or the measurement reference may be deformed by thermal expansion. Also, the air density along the light path of the laser interferometer may be disturbed. They may cause degradation of workpiece positioning precision. Additionally, thrust ripple to be produced when coils are changed may interfere precise positioning of the stage.

In a case of stage system wherein a voice coil motor and a clutch are provided in parallel between an actuator unit and a stage, as in the second example described above, since the clutch is held in engagement during the stage motion through the actuator unit, the voice coil motor is inoperative. In the rough motion period of the actuator unit, therefore, deviations to the stage target position may be accumulated, which means prolongation of positioning time required for the voice coil motor. Further, since the clutch is based on mechanical contact such as friction, there is a limit to stage precise positioning.

If the voice coil motor is operated while disengaging the clutch, in actuation of the actuator unit, the voice coil motor has to produce a large thrust force which causes large heat generation and lowered stage positioning precision.

Additionally, if the driving stroke of the voice coil motor is short, the stator of the motor must be positioned very precisely with respect to the moving element provided on the stage. In that case, the positioning of the rod by the actuator unit has to be performed vary precisely. However, the rod positioning control through the actuator unit is based on the current position of the stage as measured by the laser interferometer, it is very difficult to accomplish high precision positioning for the rod.

SUMMARY OF THE INVENTION

It is an object of the present invention to provide a high precision and high speed stage system by which at least one of the problems described above can be solved.

In accordance with an aspect of the present invention, there is provided a stage system, comprising: a stage being movable in a predetermined direction; a first unit for applying a force to the stage in the predetermined direction; moving means for moving one of the first unit and a structure including the first unit; first measuring means for measuring at least one of the position and movement amount of the stage; and second measuring means for measuring at least one of the position and movement amount of one of the first unit and the structure; wherein the stage is controlled on the basis of a measured value of said first measuring means, and wherein said moving means is controlled on the basis of a measured value of said second measuring means.

In preferred forms of this aspect of the present invention, the first unit may be controlled on the basis of a measured value of said first measuring means. The first unit may be controlled on the basis of information related to a target position of the stage. The first unit may include a linear motor. The first unit may have a function applying a force to a gravity center of the stage. The moving means may be controlled on the basis of information related to a target position of the stage. The moving means may include one of a linear motor and a ball screw. The stage may be made movable in three freedom directions. The first unit may be operable to apply a force to the stage in three freedom directions. The moving means may be operable to move one of the first unit and the structure in one freedom direction. The stage may be made movable in six freedom directions. The first unit may be operable to apply a force to the stage in six freedom directions. The moving means may comprise an X-Y stage. The stage system may further comprise a second unit separate from the first unit. The second unit may be controlled on the basis of information related to a target position of the stage. The second unit may be feed-forward controlled on the basis of information related to a target position of the stage. The information may concern acceleration of the stage. The second unit may have a function for applying a force to a gravity center of the stage.

The stage system may further comprise second moving means for moving one of the second unit and a second structure including the second unit. The moving means may be operable to move the first and second units integrally. The second unit may include an electromagnet. The second unit may include at least one set of electromagnets for producing forces opposite to each other and parallel to said predetermined direction. The second may be operable to apply a force to the stage in one freedom direction. The second unit may be operable to apply a force to the stage in two freedom directions.

In accordance with another aspect of the present invention, there is provided a stage system, comprising: a stage being movable in a predetermined direction; a first unit for applying a force to the stage in a predetermined direction; a second unit separate from the first unit, for applying a force to the stage in the predetermined direction; and moving means for moving one of the second unit and a structure including the second unit; wherein positioning of the stage is performed on the basis of the first unit, and wherein acceleration and deceleration of the stage are performed on the basis of the second unit.

In preferred forms of this aspect of the invention, the second unit may be operable to produce a force larger than that produced by the first unit. For production of the same driving force, heat generation of the second unit may be smaller than that of the first unit. The first unit may be operable to produce an electromagnetic force by use of a coil and a magnet, and the second unit may be operable to produce an attraction force by use of a magnetic element and an electromagnet. The second unit may include at least one set of electromagnets for producing forces opposite to each other and parallel to said predetermined direction. The stage system may further comprise first measuring means for measuring a position of the stage. The first unit may be controlled on the basis of a measured value of said first measuring means. The stage system may further comprise second measuring means for measuring at least one of a position and movement amount of the second unit. The moving means may be controlled on the basis of a measured value of said second measuring means.

The second unit may have a function of applying a force to the stage throughout a movement stroke of the stage. The moving means may be operable to move the first and second units integrally. The stage system may further comprise second moving means for moving one of the first unit and a second structure including the first unit. The stage system may further comprise third measuring means for measuring at least one of a position and movement amount of one of the first unit and the second structure including the first unit. The second moving means may be controlled on the basis of a measured value of said third measuring means. The stage system may further comprise acceleration information producing means for producing a signal related to acceleration of the stage, and positional information producing means for producing a signal related to a position of the stage, wherein the first unit may be controlled on the basis of a signal from said positional information producing means, and the second unit may be controlled on the basis of a signal from said acceleration information producing means.

The second unit may be feed-forward controlled on the basis of a signal from said acceleration information producing means. The moving means may be controlled on the basis of a signal from said positional information producing means. The stage may be made movable in three freedom directions. The first unit may be operable to apply a force to the stage in three freedom directions. The second unit may be operable to apply a force to the stage in one freedom direction. The moving means may be operable to move one of the first unit and the structure including the first unit, in one freedom direction. The stage may be made movable in six freedom directions. The first unit may be operable to apply a force to the stage in six freedom directions. The second unit may be operable to apply a force to the stage in two freedom directions. The moving means may have a function of moving one of the second unit and the structure including the second unit, in two freedom directions. The moving means may comprise an X-Y stage. The first unit may have a function of applying a force to a gravity center of the stage. The second unit may have a function of applying a force to a gravity center of the stage.

In accordance with a further aspect of the present invention, there is provided a stage system, comprising: a stage being movable in a predetermined direction; a unit for applying a force to the stage in the predetermined direction; moving means for moving one of the unit and a structure including the unit; first measuring means for measuring at least one of the position and movement amount of the stage; second measuring means for measuring at least one of the position and movement amount of one of the unit and the structure; and signal producing means for producing a signal on the basis of a target position of the stage; wherein the unit is controlled on the basis of a signal from said signal producing means and of a signal from said first measuring means, and wherein said moving means is controlled on the basis of a signal from said signal producing means and of a signal from said second measuring means.

In preferred forms of this aspect of the invention, the unit may be controlled on the basis of a difference between the signal from said signal producing means and a signal from said first measuring means. The moving means may be controlled on the basis of a difference between a signal from said signal producing means and a signal from said second measuring means. The signal from said signal producing means may relate to the position of the stage. The unit may include a linear motor. The stage system may further comprise a second unit separate from the unit, for applying a force to the stage. The second unit may be feed-forward controlled on the basis of a signal from said signal producing means. The second unit can be moved by one of said moving means and second moving means separate from said moving means. The second unit may include an electromagnet.

In accordance with a yet further aspect of the present invention, there is provided a stage system, comprising: a stage being movable in a predetermined direction; and a unit having a magnetic element and at least one set of electromagnets disposed on the opposite sides of the magnetic element; wherein one of the magnetic element and the electromagnets of the unit is held by the stage, and wherein the magnetic element and the electromagnets are kept opposed to each other regardless of rotational motion of the stage.

In preferred forms of this aspect of the invention, the magnetic element and the electromagnets may have opposed faces having one of a cylindrical shape and a spherical shape. The magnetic element may have one of an arcuate shape and a cup-like shape. The electromagnets may have an E-shape. An end face of the E-shape electromagnets may have one of an arcuate shape and a cup-like shape. The stage may be made movable in X and Y directions, and the unit may include at least two sets of electromagnets disposed to sandwich the magnetic element with respect to X and Y directions. The stage system may further comprise moving means for moving the other of the magnetic element and the electromagnets, not held by the stage, such that the magnetic element and the electromagnets can be held opposed to each other regardless of motion of the stage. The magnetic element may be disposed on the stage side. The stage system may further comprise adjusting means for adjusting a combined force of the electromagnets to a predetermined level. The unit may have a function of applying a force to a gravity center of the stage.

There may be provided an exposure apparatus and a device manufacturing method, using any one of the stage systems described above, within the scope of the present invention.

In accordance with a still further aspect of the present invention, there is provided a stage driving method, comprising: a first measuring step for measuring at least one of a position and movement amount of a stage being movable in a predetermined direction; a second measuring step for measuring at least one of a position and movement amount of one of a unit having an actuator and a structure including the unit; an applying step for applying a force to the stage through the unit; a moving step for moving the unit in a predetermined direction through moving means; a first control step for controlling the stage on the basis of a first measured value produced in said first measuring step; and a second control step for controlling at least one of the position and movement amount of one of the unit and the structure, on the basis of a second measured value produced in said second measuring step.

In preferred forms of this aspect of the invention, said second control step may include a step for controlling the unit. In the unit controlling step, the unit may be controlled on the basis of the first measured value and a target value. The method may further comprise a second applying step for applying a force to the stage through a second unit separate from the unit. The second unit may be feed-forward controlled on the basis of a target value.

In accordance with a still further aspect of the present invention, there is provided a stage driving method, comprising: a first measuring step for measuring at least one of a position and movement amount of a stage being movable in a predetermined direction; a second measuring step for measuring at least one of a position and movement amount of one of a unit having an actuator and a structure including the unit; an applying step for applying a force to the stage through the unit; a moving step for moving the unit in a predetermined direction through moving means; a signal producing step for producing a signal on the basis of a target position of the stage; a first control step for controlling the stage on the basis of a first measured value produced in said first measuring step and of a signal produced in said signal producing step; and a second control step for controlling at least one of the position and movement amount of one of the unit and the structure, on the basis of a second measured value produced in said second measuring step and a signal produced in said signal producing step. The method may further comprise detecting a difference between a signal produced in said signal producing step and the first measured value, or detecting a difference between a signal produced in said signal producing step and the second measured value.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 11A and 11B, is a control diagram of the wafer stage system of the fourth embodiment.

DESCRIPTION OF THE PREFERRED EMBODIMENTS

Preferred embodiments of the present invention will now be described with reference to the accompanying drawings.

[Embodiment 1]

Figure 1:
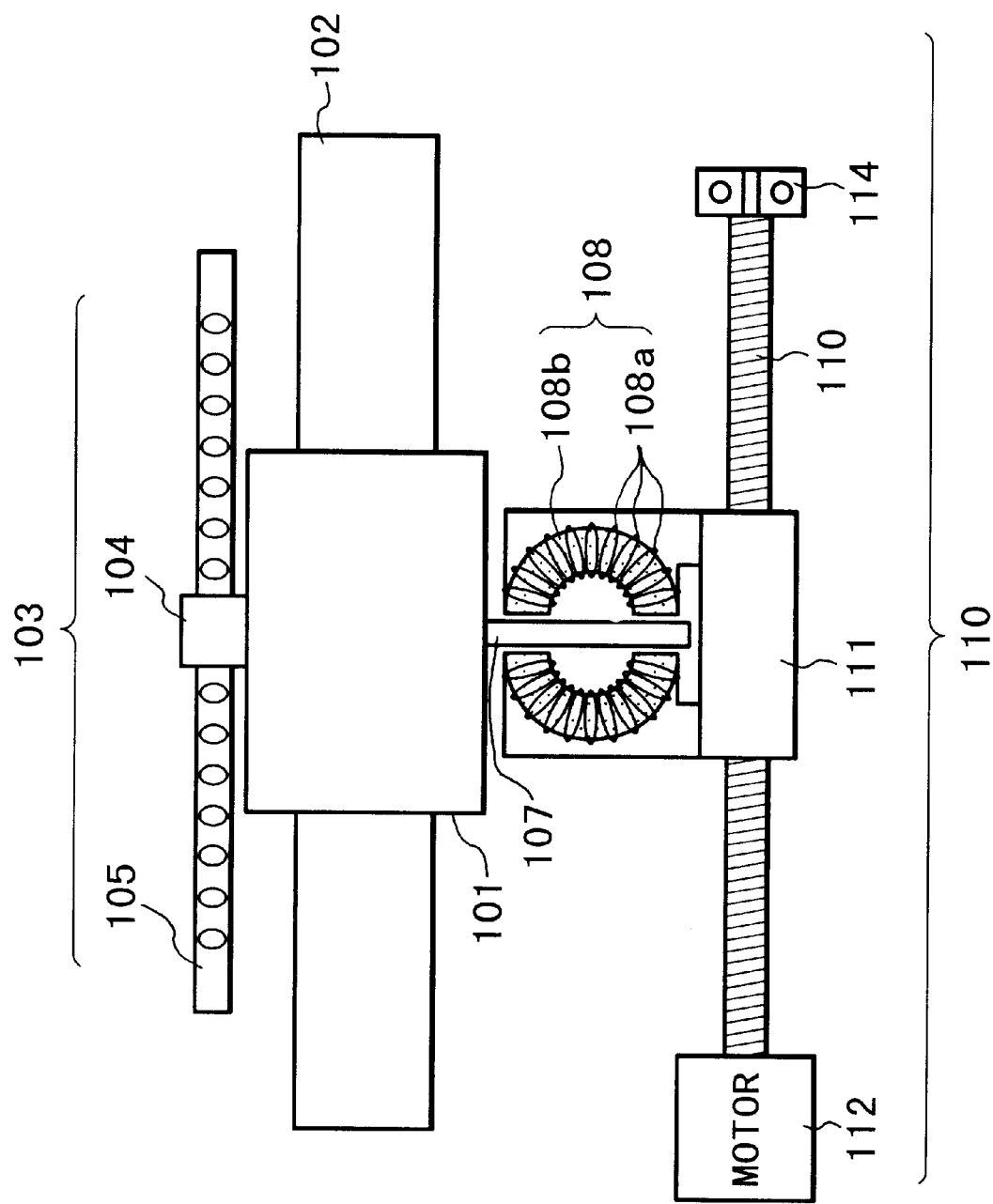
FIG. 1 is a schematic view of a stage system according to a first embodiment of the present invention.

FIG. 1 is a schematic view of a stage system according to a first embodiment of the present invention.

A guide 102 is fixed to a base (not shown), and a stage 101 for carrying a workpiece thereon is supported by the guide 102 reciprocally slidably along one axial direction (predetermined direction) relative to it. There is a linear motor moving element 104 fixedly mounted at one side of the stage 101. The moving element 104 faces to a linear motor stator 105 without contact thereto. The linear motor stator 105 is fixed to the base, not shown.

The linear motor 103 may have a similar mechanism as that of the example described hereinbefore, but it may be of small output type as compared with the described example. The linear motor is provided with a control system having a hardware or software current limiting system, so that flow of large electric current causing large heat generation is prevented. Additionally, as long as the control system operates normally, there is no flow of electric current causing such heat generation, regardless of the provision of the limiting system (this will be described later).

A magnetic material plate 107 is provided on the other side of the stage 101. There are a pair of electromagnets 108 disposed opposed to each other, while sandwiching the magnetic material plate 107 therebetween. The electromagnets 108 are held fixed by using a nut 111. The nut 111 can be moved substantially in the same direction as the stage 101, by means of a motor 112 and a feed screw 113. Thus, by means of the feed screw system 101 having nut 111, motor 112 and feed screw 113, the paired electromagnets 108 can be moved substantially in the same direction as the stage 101.

The feed screw system 110 (moving mechanism) for moving the electromagnets 108 is fixed to the unshown base. Each electromagnet 108 of the paired electromagnets and the magnetic material plate 107 are held out of contact with each other, with a small clearance. Each electromagnet 108 comprises a yoke 108b of arcuate shape and a coil 108a wound around it. When electric current flows through the coil 108a, an attraction force is produced between the yoke 108b and the magnetic material plate 108. The flow of electric currents to the coils 108a of the electromagnets 108 can be controlled independently of each other. Therefore, by adjusting the currents to be applied to the coils, attraction forces to be produced between the magnetic material plate and the electromagnets can be adjusted. Thus, the combined force applied to the magnetic material plate from the paired electromagnets as well as the direction thereof can be adjusted.

Figure 2:
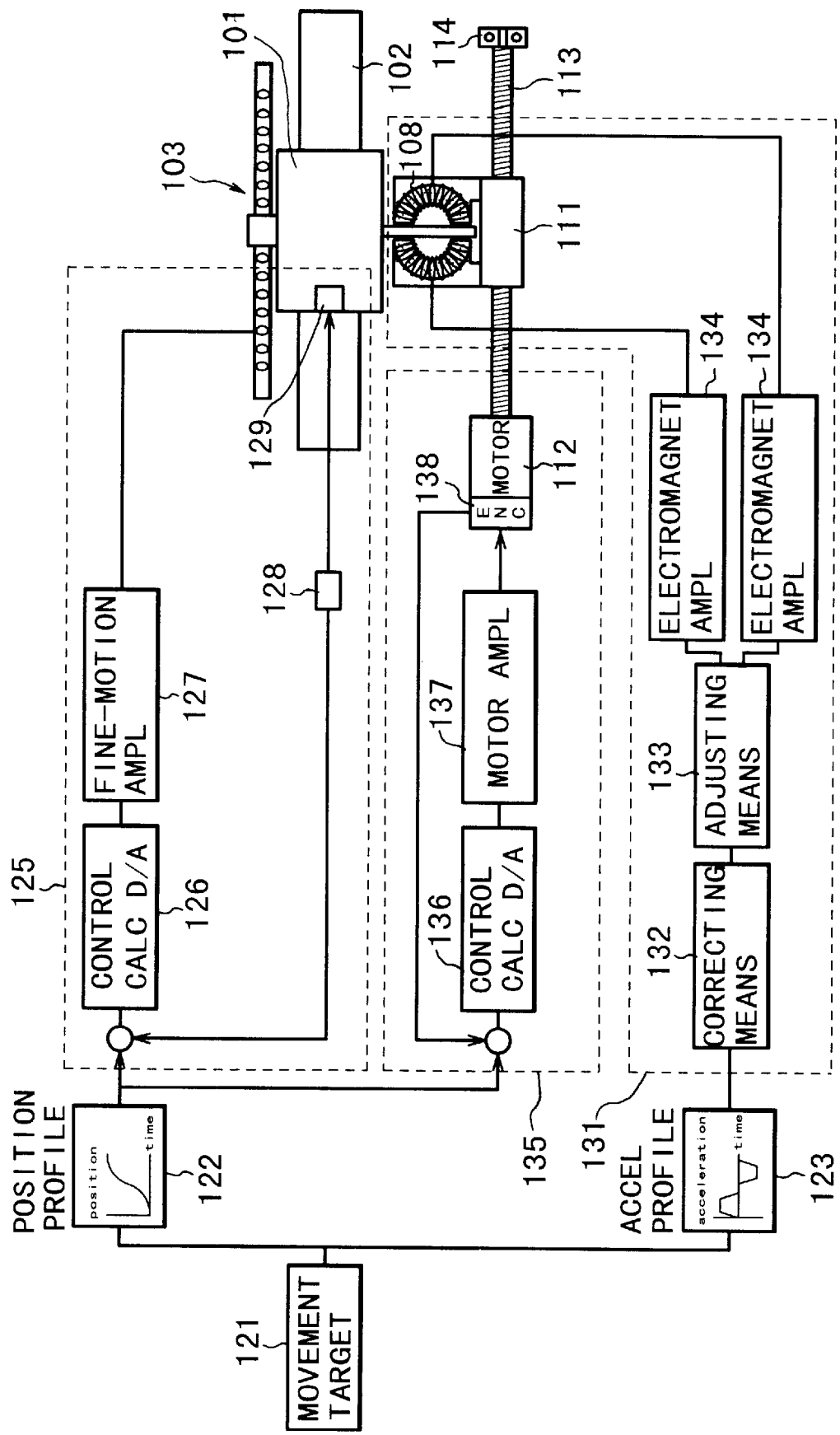
FIG. 2 is a block diagram of a control system in the stage system of the first embodiment.

FIG. 2 is a block diagram of a control system for drive controlling the stage system. It comprises movement target specifying means 121 for creating a movement target for the stage 101, position profile producing means 122 for generating the relationship between the time and the stage target position corresponding to that time, on the basis of the created target, and acceleration profile producing means 123 for generating the relationship between the time and the acceleration to be provided during that time, on the basis of the created target.

The output of the position profile producing means 122 is applied to a fine-motion linear motor position servo system 125 for controlling a fine-motion linear motor 103 and to a movement feedback (FB) system 135 for feedback controlling the motor 112 of the feed screw system 110. The output of the acceleration profile producing means 123 is applied to an attraction feed-forward (FF) system 131 for feed-forward controlling the attraction force of the electromagnet 108.

The fine-motion linear motor position servo system 125 comprises calculating means 126, a motor current amplifier 127, a linear motor 103 and an interferometer 128. The calculating means 126 operates to perform control calculation, typically such as PID, for example, to a difference between a current target position of the stage as specified by the position profile producing means 122 and the current position of the stage 101 as measured by the interferometer 128. The result of calculation is applied, as an analog voltage, to the amplifier 127. The motor current amplifier 127 is a fine-motion current amplifier for supplying an electric current, proportional to the produced analog output voltage, to the linear motor. The linear motor 103 has a structure such as described above, and, in response to the supplied current, it applies thrust to the stage 101. The interferometer 128 serves to measure the position of a reflection mirror 129 mounted on the stage 101, and thus to measure the position of the stage (or a moving element provided integrally with the stage). The fine-motion linear motor position servo system 125 is an ordinary position servo system which is operable while using the output of the position profile producing means 122 as a designation signal. When large thrust is necessary, the attraction feed-forward (FF) system 131 operates to produce the thrust. Thus, the linear motor 103 is required to produce only small thrust necessary for removing a positional error with respect to the target position. Therefore, there is no flow of electric current that may cause large heat generation. Additionally, the flow of electric current is limited by hardware or software, such that, even if the operational association with the attraction feed forward (FF) system 131 is out of order, flow of electric current causing serious heat generation can be prevented.

The attraction feed-forward (FF) system 131 is a control system for producing combined thrust between the magnetic material plate 107 and the paired electromagnets 108, which thrust is proportional to the output of the acceleration profile producing means 123. The attraction FF system 131 comprises correcting means 132, adjusting means 133 and two electromagnet current amplifiers 134. The electromagnet current amplifiers 134 serve to energize the coils 108a of the electromagnets 108, independently of each other.

The correcting means 132 functions to correct non-linear relationship between the electric current and attraction force of the electromagnet 108, and it includes a square root calculator. Generally, the attraction force of an electromagnet is proportional to a square of the electric current to the electromagnet. The attraction force to be produced to drive the stage 101 is a force which is proportional to the output of the acceleration profile producing means. Therefore, once the square root of the output of the acceleration profile producing means 123 is detected and it is taken as a designating signal, an attraction force proportional to the square of the square root of the output of the acceleration profile producing means 123 can be produced. Also, since the sign of the output of the acceleration profile producing means 123 may be either positive or negative, the square root calculation may be made to an absolute value of the output and, after the calculation, the sign may be specified when the result is applied to the adjusting means.

The adjusting means 133 serves to adjust attraction forces functioning between the paired electromagnets 108 and the magnetic material plate 107, so that these forces are combined into a force of desired magnitude and orientation. Regardless of the direction of electric current, the electromagnet can produce only a force for attracting the magnetic material plate. In consideration of this, a pair of electromagnets are placed to sandwich the magnetic material plate therebetween, so that these electromagnets produce and apply opposite forces to the magnetic material plate. By adjusting these two forces, the magnitude and orientation of a combined force acting on the magnetic material plate is controlled. One convenient control procedure may be that: in accordance with the sign of the output of the correcting means 132 described above, one of the paired electromagnets to which the electric current is to be applied is selected, and a value proportional to the output of the correcting means 132 is applied to the current amplifier 134 while the electric current to the other electromagnet 108 is kept null. If the output of the correcting means 132 is null. The electric current to both electromagnets is controlled to null. As a result of this, a thrust which is proportional to the output of the acceleration profile producing means 123 is applied from the paired electromagnets 108 to the magnetic material plate 107, in a desired direction.

Bias electric currents of the same level may be applied to the two electromagnets 108 when the output of the correcting means 132 is null. This provides an effect that the relation between the current and the operation center of BH curve of the electromagnet, that is, the relation between the strength of magnetic field and the magnetic density becomes more linear. In that occasion, the correcting means 132 and the adjusting means 133 may function integrally to designate, in response to the output of the acceleration profile 123, appropriate currents for the two electromagnets. More specifically, if the output of the acceleration profile producing means in the positive movement direction is Va, the bias current is Ib, the electromagnet coil current for producing an attraction force in the positive movement direction is Ip, the electromagnet coil current for producing an attraction force in the negative movement direction is Im, then, for a predetermined proportional constant K, those Ip and Im satisfying a relation $Va=K[(Ip-Ib)^2-(Im-Ib)^2]$ may be outputted.

The attraction force of an electromagnet can produce large thrust with a small ampere-turn as compared with the Lorentz force of a linear motor. Thus, as compared with heat generation during acceleration and deceleration of a stage only by using a linear motor, heat generation of electromagnet is very small and it does not cause any inconvenience.

During constant speed motion, the electric currents to the electromagnets 108 are controlled to be null. Thus, any external disturbance such as floor vibration is not transmitted to the stage system through the electromagnets. In this state, only the fine-motion linear motor controls the stage with high precision.

The movement feedback (FB) system 135 functions to cause the positions of the pair of electromagnets 108 to move and follow the position profile. While an electromagnet has an advantage that a large attraction force is produced with small heat generation, the clearance to a magnetic material opposed to it should be kept small. In order to assure that a desired force is continuously applied from the electromagnet 108 to the magnetic material plate 107 and then to the stage 101, the electromagnet 108 should be moved in accordance with the motion of the stage 101 so that the clearance is maintained constant. In consideration of this, the position profile is inputted into the position control system 135 which serves to feed back the position of the electromagnet 108 through an encoder 138 of the motor 112, such that the electromagnet 108 is moved by means of the motor 112 and the feed screw 113 to follow the position profile substantially the same as that of the stage 101. As a result, the relative positions of the electromagnet 108 and the stage 101 can be held substantially constant.

The motor 112 should produce a torque corresponding to the combined force of attraction forces produced by the electromagnets 108 during acceleration or deceleration of the stage 101, in addition to a torque necessary for the acceleration or deceleration of the electromagnet 108 and the nut Ill of the screw system 110. This is because the attraction force applied to the stage is also transmitted to the nut through the electromagnet.

Further, if positional errors of the stage 101 during acceleration thereof are accumulated in the position control system 125, it is undesirable since it causes prolongation of stabilization time for the position control (or speed control) after complection of the acceleration. In consideration of this, in addition to the structure of FIG. 2, the output of the acceleration profile producing means 123 may be added to the output of the control calculator and the sum may be inputted into the motor current amplifier 137. This enables designation of acceleration to the motor 112 like feedforward control, and therefore, the electromagnet 108 can be moved without accumulation of positional errors during the acceleration period of the stage 101. Any way, there is a certain amount of heat generation in the motor 112. However, since the heat source is concentrated locally, it can be cooled relatively easily. Since it can be placed remote from the stage 101 or the workpiece mounted thereon, the heat generation has substantially no influence on the stage 101 or the workpiece thereon. During constant speed motion of the stage 101 after the acceleration period, the screw feed system 110 moves the nut 111 position substantially at the same speed as the stage 101 so that the electromagnet 108 is kept out of contact with the magnetic material plate 107.

The stage 101 is accelerated by means of the feed screw system 110 and the electromagnets 108 as described above and, when the acceleration is completed, the electric currents to the electromagnets are made null, whereby floor vibration is isolated. Simultaneously therewith, by using the screw feed system 110, the positions of the electromagnets 108 are controlled in synchronism with the stage motion so that they are kept out of contact with the magnetic material plate 107. In parallel to these operations, the fine-motion linear motor 103 performs position control (or speed control) constantly at high precision. By this, large thrust and low heat generation as well as high precision position control are accomplished at the same time.

In this embodiment, the stage is driven by using an attraction force produced between the magnetic material plate and the electromagnet. Therefore, the stage can be driven without contact and with low heat generation.

Further, there is a feed screw driving system for moving the electromagnets. This enables moving the stage on the basis of attraction force, for a long stroke. When the electromagnet is being moved by the feed screw system, the driving force of the feed screw system is transmitted to the stage through the attraction force produced between the electromagnet and the magnetic material plate. Thus, the electromagnet and the magnetic material plate function as like a non-contact clutch for transmitting the driving force of the feed screw system to the stage.

Provision of the linear motor in parallel enables combined use of stage driving based on attraction force of the electromagnet and stage driving based on the Lorentz force of the linear motor. Therefore, for stage acceleration or deceleration which needs large thrust, the stage driving may preferably be made on the basis of attraction force of electromagnet with small heat generation, while in the constant speed stage motion or stage positioning control which does not need large thrust, the linear motor may desirably be used.

This embodiment uses a combination of stage driving means based on attraction force of electromagnet and linear motor means. However, use of the linear motor is not always necessary for the stage driving or positioning. If there are an electromagnet and a magnetic material plate as well as a driving system for moving the electromagnet, the stage positioning operation can be performed. Further, as regards the driving system for moving the electromagnet, only a positioning precision for keeping an approximately constant clearance between the electromagnet and the magnetic material plate is required. Thus, very high positioning precision as the stage positioning precision is not required for the feed screw system.

In this embodiment, since an attraction force is to be produced between the electromagnet and the magnetic material plate, the magnetic material may preferably contain ion. However, this is not a requirement. If, for example, a permanent magnet or an electromagnet is used as the magnetic material member, the stage can be driven on the basis of repulsion force, not attraction force. Since however the attraction force of electromagnet is more efficient than the repulsion force, use of attraction force may be preferable.

In accordance with this embodiment, the stage driving based on attraction force can be performed without contact. Thus, during stage acceleration or deceleration based on electromagnet, the linear motor can be operated simultaneously. This enables a high precision positioning operation even during the acceleration or deceleration period.

In this embodiment, the electromagnet is provided at the feed screw side while the magnetic material member is disposed at the stage side. While this may be reversed, placing the magnetic material member at the stage side as in this embodiment may be convenient since, as compared with a structure wherein the electromagnet is disposed at the stage side, there is no necessity of putting wiring on the stage, such that external disturbance of the stage can be reduced.

While this embodiment uses a feed screw for moving the electromagnet, it is not a requirement. Any other mechanism may be used provided that it moves the electromagnet in synchronism with the stage motion. A belt or cylinder mechanism may be used to move the electromagnet, for example.

[Embodiment 2]

Figure 3:
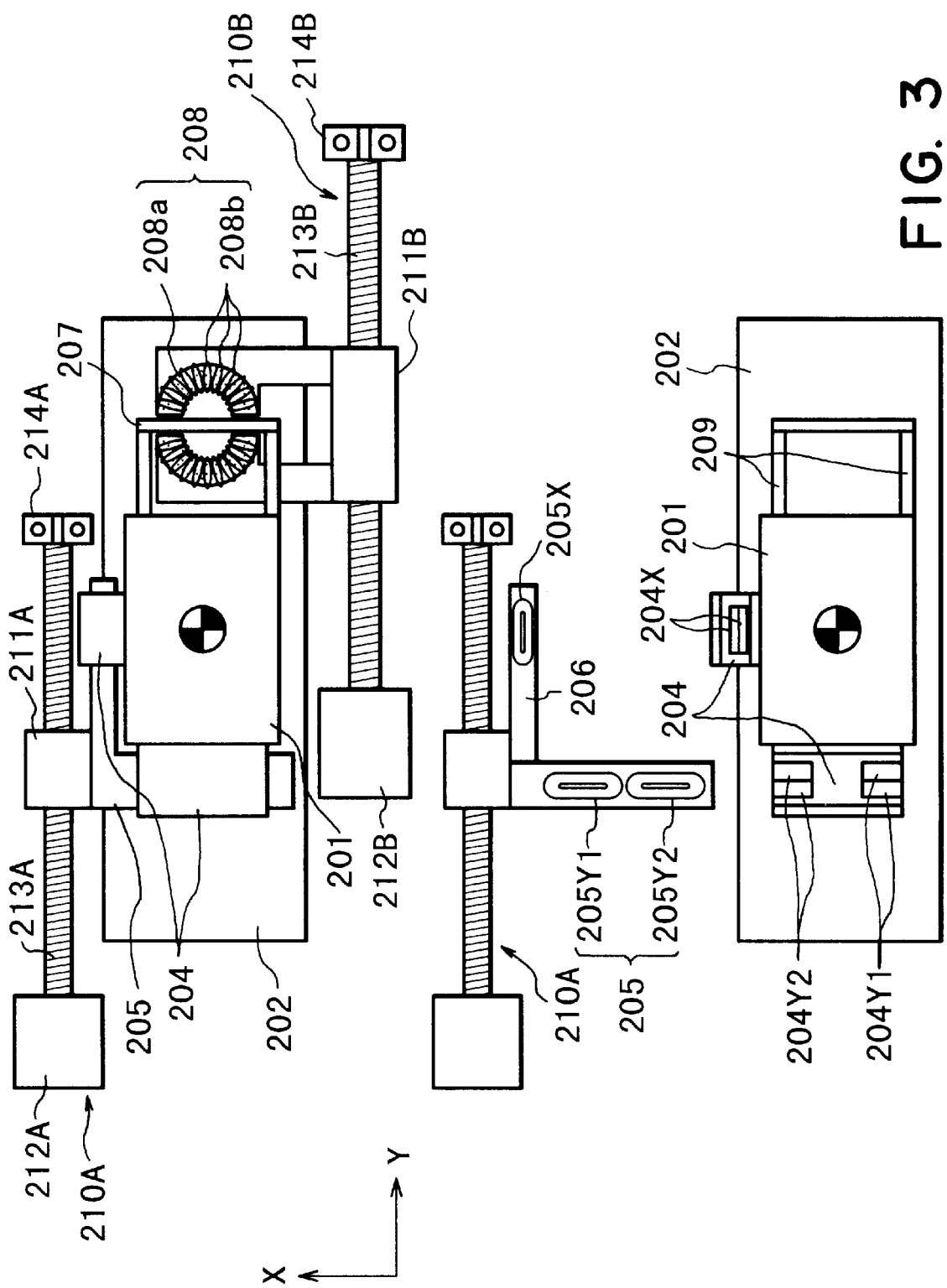
FIG. 3 is a schematic view of a stage system according to a second embodiment of the present invention.

FIG. 3 illustrates a stage system according to a second embodiment of the present invention.

A flat surface guide is fixedly mounted on a base, not shown. A stage 201 for carrying a workpiece thereon is supported by the guide for translational motion along two axes (X and Y) and sliding motion in rotational direction (θ). At two sides of the stage 201, there are linear motor moving elements 204 fixedly mounted which are disposed opposed to a linear motor stator 205 without contact thereto. The stator 205 is fixedly connected to a nut 211A through a supporting frame 206.

This embodiment uses at least three sets of linear motors. Each linear motor has a structure with a two-pole magnet and one coil as can be extracted out of a conventional linear motor. It produces Lorentz force in accordance with the interactive function of coil electric current and magnetic flux of magnet. The linear motor has a moving element provided by an integral structure of two-pole magnet and yoke. The linear motor stator is provided by three coils of oblong or elliptical shape. When an electric current is applied to the coil, a thrust is produced in a direction normal to the straight portion of the elliptical coil.

A coil 205X cooperates with a magnet 204X to produce a force in X direction, to thereby apply a force to the stage 201. Coils 201Y1 and 205Y2 cooperate with magnets 204Y1 and 204Y2, respectively, to produce forces in Y direction, respectively, to thereby apply a force to the stage 201. When the forces to be produced by the coils 205Y1 and 205Y2 are put in opposite directions to each other, a force in θ direction can be applied to the stage 201. By controlling electric currents to be applied to the coils 205Y1, 205Y2 and 205X, application of forces in X and Y directions as well as in rotational direction to the stage 201 can be controlled. The X coordinate of the gravity center of the stage 201 is designed so that it is put between the lines of action of the forces to be produced by the coils 205Y1 and 205Y2, while the Y coordinate of the stage gravity center is designed so that it is put on the line of action of the force to be produced by the coil X. Preferably, the distance between the coil 205Y1 and the stage gravity center X coordinate is made equal to the distance between the coil 205Y2 and the stage gravity center X coordinate.

As compared with the first embodiment, in this embodiment there is no guide for mechanically restricting rotation of the stage 201. For this reason, it is desirable that the line of action of a driving force for applying translational force in the X or Y directions to the stage 201 extends through the gravity center of the stage. When the linear motors are structured such as described above, in response to application of electric currents of the same level to the coils 205Y1 and 205Y2 as well as an electric current of appropriate level to the X coil 205X, the transnational force goes through the gravity center and, thus, no rotational force is produced. Therefore, for the same translational force, the heat generation can be minimized. If a rotational force is to be applied to the stage 201, electric currents of the same magnitude but-of opposite directions may be applied to the coils 205Y1 and 205Y2.

The linear motor stator 205 is fixed to the nut 211A. The nut 211A can be moved in Y direction, by means of a feed screw 213A and a motor 212A. As compared with the linear motor of the preceding embodiment. In the linear motor of this embodiment, the relative stroke of the stator 205 and the moving element 204 is short so that a force can not be applied to the moving element through a long stroke. In consideration of this, in this embodiment, in order that a force can be applied to the linear motor moving element for a long stroke, the linear motor stator 205 is made movable in Y direction by means of a feed screw system 210A. This enables that, throughout the movable stroke of the stage 201 motion, the linear motor stator 205 applies, to the linear motor moving element 204, a translational force in Y direction and a rotational force for the stage 201. As regards X direction, since only small distance motion that can be covered by the stroke of the linear motor is required, the linear motor stator is not provided with a motion mechanism in X direction. With the structure described above, long stroke motion of the stage without coil changing is accomplished.

The linear motor is provided with a control system having a hardware or software current limiting system, so that flow of large electric current causing large heat generation is prevented. Additionally, as long as the control system operates normally, there is no flow of electric current causing such heat generation, regardless of the provision of the limiting system (this will be described later).

A magnetic material plate 207 is provided on the other side of the stage 201. There are a pair of electromagnets 208 disposed opposed to each other, while sandwiching the magnetic material plate 207 therebetween with respect to Y direction. The electromagnets 208 are held fixed by using a nut 211B. The nut 211B can be moved substantially in the same direction as the stage 201, by means of a motor 212B and a feed screw 213B. Thus, by means of the feed screw system 201B having nut 211B, motor 212B and feed screw 213B, the paired electromagnets 208 can be moved substantially in the same direction as the stage 201. By moving the electromagnets 208 by using the feed screw system 210B, the clearance between the electromagnets 208 and the magnetic material plate 207 can be maintained throughout the long stroke in Y direction, such that the stage can be moved through the long stroke in Y direction on the basis of the attraction force between the magnetic material plate 207 and the electromagnets 208.

The feed screw system 210B for moving the electromagnets 208 is fixed to the unshown base. Each electromagnet of the paired electromagnets and the magnetic material plate are held out of contact with each other, with a small clearance. Each electromagnet 208 comprises a yoke 208b of arcuate shape and a coil 208a wound around it. When electric current flows through the coil 208a, an attraction force is produced between the yoke 208b and the magnetic material plate 208. The flow of electric currents to the coils of the electromagnets can be controlled independently of each other. Therefore, by adjusting the currents to be applied to the coils, attraction forces to be produced between the magnetic material plate and the electromagnets can be adjusted. Thus, the combined force applied to the magnetic material plate from the paired electromagnets as well as the direction thereof can be adjusted.

In this embodiment, as compared with the first embodiment, there is no guide for mechanically restricting rotation of the stage. If therefore the line of action of the combined force of attraction forces of the electromagnets is deviated from the gravity center of the stage, a rotational force is produced in the stage. In consideration of it, the line of action of the combined force of the attraction forces of the two electromagnets is made to pass through the gravity center of the stage. When this is accomplished, no rotational force is produced in the stage during the stage acceleration in Y direction by the electromagnets. The Y1 and Y2 coils do not need to produce forces to prevent rotation.

The linear motor means for such three-axis control system may preferably be made to operate to apply forces to the stage at least at two sides of the stage or from two locations. In the example of this embodiment, forces are applied to the stage from two sides which are orthogonal to each other. If forces in three-axis directions are produced from only one side, either one of the lines of action of X and Y directions of translation will not pass through the stage gravity center. Therefore, a rotational force will be produced in the stage, and it needs correcting rotational force for suppressing the same.

Figure 4:
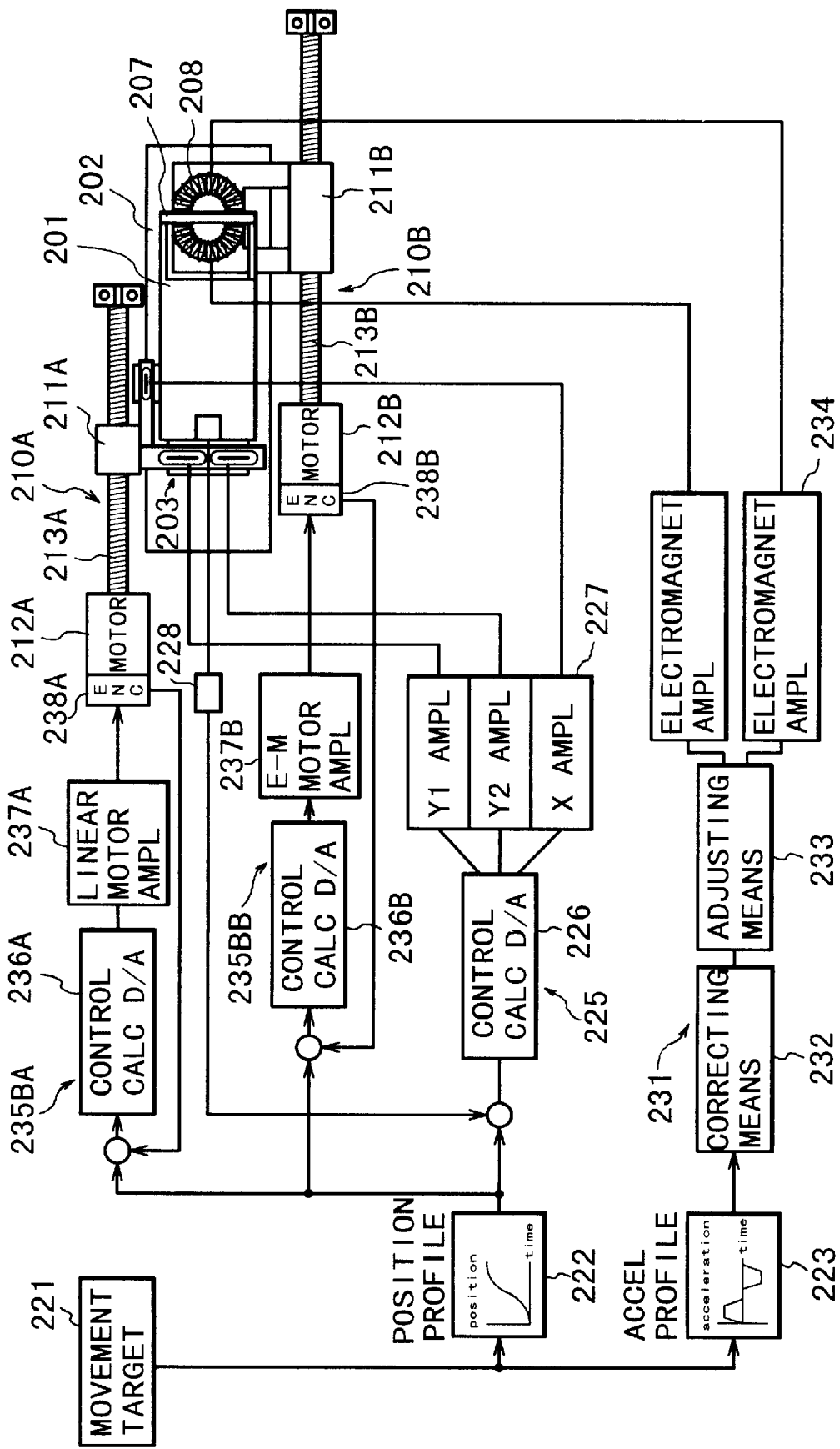
FIG. 4 is a block diagram of a control system in the stage system of the second embodiment.

FIG. 4 is a block diagram of a control system for drive controlling the stage system. It comprises movement target specifying means 221 for creating a movement target for the stage 201, position profile producing means 222 for generating the relationship between the time and the stage target position corresponding to that time, on the basis of the created target, and acceleration profile producing means 223 for generating the relationship between the time and the acceleration to be provided during that time, on the basis of the created target.

The output of the position profile producing means 222 is applied to a fine-motion linear motor position servo system 225 for controlling a fine-motion linear motor 203 and to a movement feedback (FB) system 235A for feedback controlling the motor of the feed screw system 210A, for moving the linear motor stator 205 in Y direction, as well as to a movement feedback (FB) system 235B for feedback controlling the motor of the feed screw system 210B, for moving the electromagnets 208 in Y direction The output of the acceleration profile producing means 223 is applied to an attraction feed-forward (FF) system 231 for feed-forward controlling the attraction force of the electromagnet 208.

The fine-motion linear motor position servo system 225 comprises calculating means 226, a motor current amplifier 227, a linear motor 203 and an interferometer 228. The calculating means 226 operates to perform control calculation, typically such as PID, for example, to a difference between a current target position (X, Y and θ positions) of the stage as specified by the position profile producing means 222 and the current position (X, Y and θ positions) of the stage as measured by the interferometer 228. The result of calculation is applied, as an analog voltage, to the amplifier 227. The motor current amplifier 227 is a fine-motion current amplifier for supplying an electric current, proportional to the produced analog output voltage, to each of the linear motors Y1, Y2 and X. The linear motor 203 has a structure such as described above, and, in response to the supplied current, it applies a thrust to the stage 201. The interferometer 228 serves to measure the position of a reflection mirror 229 mounted on the stage 201, and thus to measure the position (X, Y and θ positions) of the stage (or a moving element provided integrally with the stage). In FIG. 4, while the measurement of the interferometer 228 is depicted by a single measurement line, in practice, measurements in three axes are performed. Usually, a three-axis interferometer having two beams in Y direction and one beam in X direction may be used.

The fine-motion linear motor position servo system 225 is an ordinary three-axis position servo system which is operable while using the output of the position profile producing means 222 as a designation signal. When large thrust is necessary, the attraction feed-forward (FF) system 231 operates to produce the thrust. Thus, the linear motor 203 is required to produce only small thrust necessary for removing a small positional error with respect to the target position. Therefore, there is no flow of electric current that may cause large heat generation. When the attraction feed-forward (FF) system 231 produces thrust, no rotational force attributable to it is produced in the stage. The flow of electric current is limited by hardware or software, such that, even if the operational association with the attraction feed-forward (FF) system 231 is out of order, flow of electric current causing serious heat generation can be prevented.

The attraction feed-forward (FF) system 231 is a control system for producing combined thrust between the magnetic material plate 207 and the paired electromagnets 208, which thrust is proportional to the output of the acceleration profile producing means 223. The attraction FF system 231 comprises correcting means 232, adjusting means 233 and two electromagnet current amplifiers 234. These amplifiers 234 serve to energize the coils of the electromagnets, independently of each other.

The correcting means 232 functions to correct non-linear relationship between the electric current and attraction force of the electromagnet, and it includes a square root calculator.

Generally, the attraction force of an electromagnet is proportional to a square of the electric current to the electromagnet. The attraction force to be produced to drive the stage is a force which is proportional to the output of the acceleration profile producing means. Therefore, once the square root of the output of the acceleration profile producing means 223 is detected and it is taken as a designating signal, an attraction force proportional to the square of the square root of the output of the acceleration profile producing means can be produced. Also, since the sign of the output of the acceleration profile producing means 223 may be either positive or negative, the square root calculation may be made to an absolute value of the output and, after the calculation, the sign may be specified when the result is applied to the adjusting means.

The adjusting means 233 serves to adjust attraction forces functioning between the paired electromagnets 208 and the magnetic material plate 207, so that these forces are combined into a force of desired magnitude and orientation. Regardless of the direction of electric current, the electromagnet can produce only a force for attracting the magnetic material plate. In consideration of it, a pair of electromagnets 208 are placed to sandwich the magnetic material plate 207 therebetween, so that these electromagnets produce and apply opposite forces to the magnetic material plate. By adjusting these two forces, the magnitude and orientation of a combined force acting on the magnetic material plate 207 is controlled. One convenient control procedure may be that: in accordance with the sign of the output of the correcting means 232 described above, one of the paired electromagnets to which the electric current is to be applied is selected, and a value proportional to the output of the correcting means 232 is applied to the current amplifier 234 while the electric current to the other electromagnet is kept null. If the output of the correcting means is null, the electric current to both electromagnets is controlled to null. As a result of this, a thrust which is proportional to the output of the acceleration profile producing means 223 is applied from the paired electromagnets 208 to the magnetic material plate 207, in a desired direction.

Bias electric currents of the same level may be applied to the two electromagnets when the output of the correcting means 232 is null This provides an effect that the relation between the current and the operation center of BH curve of the electromagnet, that is, the relation between the strength of magnetic field and the magnetic density becomes more linear. The correcting means and the adjusting means may then function integrally to designated in response to the output of the acceleration profile, appropriate currents for the two electromagnets. More specifically, if the output of the acceleration profile producing means in the positive movement direction is Va, the bias current is Ib, the electromagnet coil current for producing an attraction force in the positive movement direction is Ip, the electromagnet coil current for producing an attraction force in the negative movement direction is Im, then, for a predetermined proportional constant K, the Ip and Im satisfying a relation Va=K[(Ip−Ib)2−(Im−Ib)2] may be outputted.

The attraction force of an electromagnet can produce large thrust with a small ampere-turn as compared with the Lorentz force of a linear motor. Thus, as compared with heat generation during acceleration and deceleration of a stage only by using a linear motor, heat generation of electromagnet is very small and it does not cause any inconvenience.

During constant speed motion, the electric currents to the electromagnets are controlled to be null. Thus, any external disturbance such as floor vibration is not transmitted to the stage system through the electromagnets. In this state, only the fine-motion linear motor controls the stage at high precision.

The movement feedback (FB) system 235A functions to cause the position of the linear motor stator 205 to move and follow the position profile. In the linear motor of this embodiment, the relative movement range of the stator 205 and the moving element 204 is short and, therefore, a force can not be applied to the moving element for a long distance. In this embodiment, in order to assure that the linear motor moving element 204 is moved in Y direction through a long distance, the linear motor stator 205 is made movable in Y direction by means of the feed screw driving system 210. As a result, throughout the movable stroke of the stage 201, a translational force in Y direction and a rotational force can be applied to the stage 201 from the linear motor stator 205. In order to accomplish this, the position profile is inputted into the position control system which serves to feed back the position of the linear motor stator 205 through an encoder 238A of the motor 212A, such that the stator 205 is moved by means of the motor 212 and the feed screw 213 in accordance with the position profile substantially the same as of the stage 201. By doing so, the relative position of the stator 205 and the stage 201 can be held substantially constant.

The motor 212 should produce a torque for accelerating the stator 205 and the nut 211A of the feed screw system 210A. Further, it is undesirable that positional errors are accumulated in the position control system at the time of completion of acceleration. In consideration of this, in addition to the structure of FIG. 4, the output of the acceleration profile producing means may be added to the output of the control calculator and the sum may be inputted into the motor current amplifier. This enables designation of acceleration to the motor, like feed-forward control. During position control or speed control for the stage 201 after the acceleration period therefor, the screw feed system 210A moves the motor stator 205 substantially at the same speed as the stage.

The movement feedback (FB) system 235B functions to move the positions of the pair of electromagnets in Y direction in accordance with the position profile. While the electromagnet 208 has an advantage that a large attraction force is produced with small heat generation, the clearance to the magnetic material plate 207 opposed to it should be kept small. In order to assure that a desired force is continuously applied from the electromagnet 208 to the magnetic material plate 207 and then to the stage 201, the electromagnet 208 also should be moved as the stage 201 is moved, so that the clearance is maintained constant. In consideration of this, the position profile is inputted into the position control system which serves to feed back the position of the electromagnet 208 through an encoder 238B of the motor 212B, such that the electromagnet 208 is moved by means of the motor 212B and the feed screw 213B in accordance with the position profile substantially the same as of the stage 201. As a result, the relative position of the electromagnet 208 and the stage 201 can be held substantially constant. The motor 212B should produce a torque necessary for the acceleration or deceleration of the electromagnet 208 and the nut 211B of the screw system driving system 210B, in addition to a torque corresponding to the combined force of attraction forces produced by the electromagnets during acceleration or deceleration of the stage.

Further, if positional errors of the stage 201 during acceleration thereof are accumulated in the position control system 225, it is undesirable since it causes prolongation of stabilization time for the position control (or speed control) after completion of the acceleration. In consideration of this, in addition to the structure of FIG. 4, the output of the acceleration profile producing means may be added to the output of the control calculator and the sum may be inputted into the motor current amplifier. This enables designation of acceleration to the motor, like feed-forward control, and therefore, the electromagnet can be moved without accumulation of positional errors during the stage acceleration. Any way, there is certain amount of heat generation in the motor. However, since the heat source is concentrated locally, it can be cooled relatively easily. Since it can be placed remote from the stage or the workpiece mounted thereon, the heat generation has substantially no influence on the stage or the workpiece thereon. During constant speed motion of the stage after the acceleration period, the screw feed system moves the nut position substantially at the same speed as the stage so that the electromagnet is kept out of contact with the magnetic material plate.

In this embodiment, the stage is accelerated by means of a feed screw system and electromagnets as described above and, when the acceleration is completed, the electric currents to the electromagnets are made null, whereby floor vibration is isolated. Simultaneously therewith, by using the screw feed system, the positions of the electromagnets are controlled in synchronism with the stage motion so that they are kept out of contact with the magnetic material plate. In parallel to these operations, the fine-motion linear motor performs position control constantly at high precision, and large thrust and low heat generation as well as high precision three-axis position control are accomplished at the same time.

The stator of the linear motor and the moving element provided on the stage are moved in accordance with position profile, and they are controlled substantially at the same position. Therefore, changing coils of the linear motor is not necessary. Thus, the stage can be driven without creation of thrust non-uniformness, and high precision positioning is assured.

The line of action of combined force of the thrust produced by the linear motor may be made to pass through the gravity center, and the line of action of the combined force of attraction forces of the electromagnets may be made to pass through the gravity center. By doing so, no unnecessary rotational force is produced in the stage during stage driving, and efficient stage driving is accomplished.

While this embodiment uses a feed screw for moving the electromagnet, it is not a requirement. Any other mechanism may be used provided that it moves the electromagnet in synchronism with the stage motion. A belt or cylinder mechanism may be used to move the electromagnet, for example.

The advantageous results attainable with the preceding embodiment are accomplished also by this embodiment.

[Embodiment 3]

Figure 5:
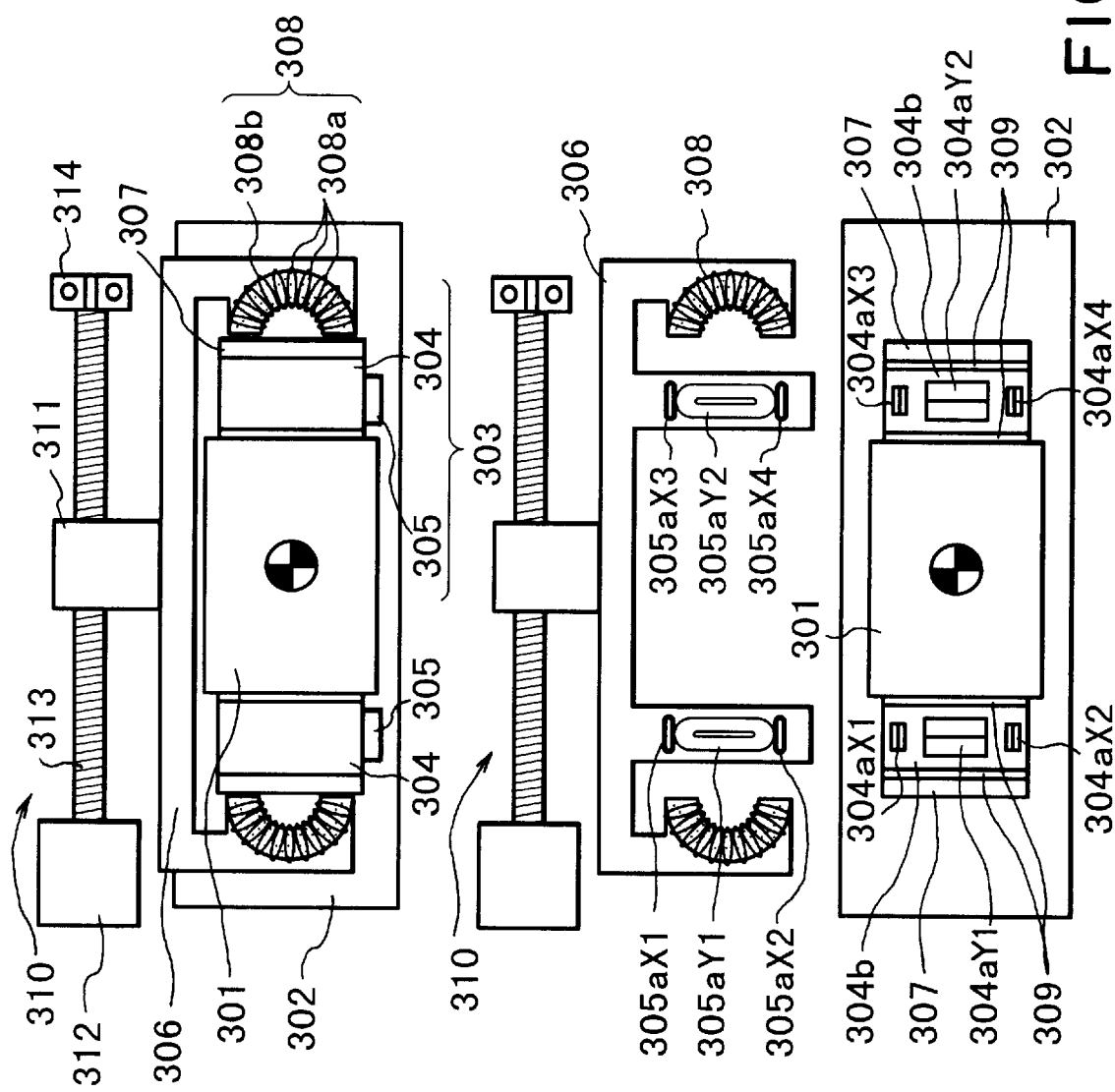
FIG. 5 is a schematic view of a stage system according to a third embodiment of the present invention.

FIG. 5 shows a stage system according to a third embodiment of the present invention.

This embodiment corresponds to a modified form of the second embodiment, and it is applied to a three-axis control stage being movable in Y-axis direction through a long stroke and being movable by a small amount in X and θ directions.

While in the second embodiment the linear motor forces are applied from two orthogonal sides of the stage, in this embodiment they are applied from opposed sides of the stage.

A linear motor 303 have six coils 305a of Y1, Y2, X1, X2, X3 and X4 as illustrated. The lines of action of the forces of two coils, such as a combination of coils X1 and X2, a combination of coils X3 and X4, or a combination of coils Y1 and Y2, are laid on the same line. The center line between the line of action of the force of coil X1 (or of coil X2) and the line of action of the force of the coil X3 (or of coil X4), as well as the line of action of the force of the coil Y1, pass through the gravity center of the stage 301.

Figure 6:
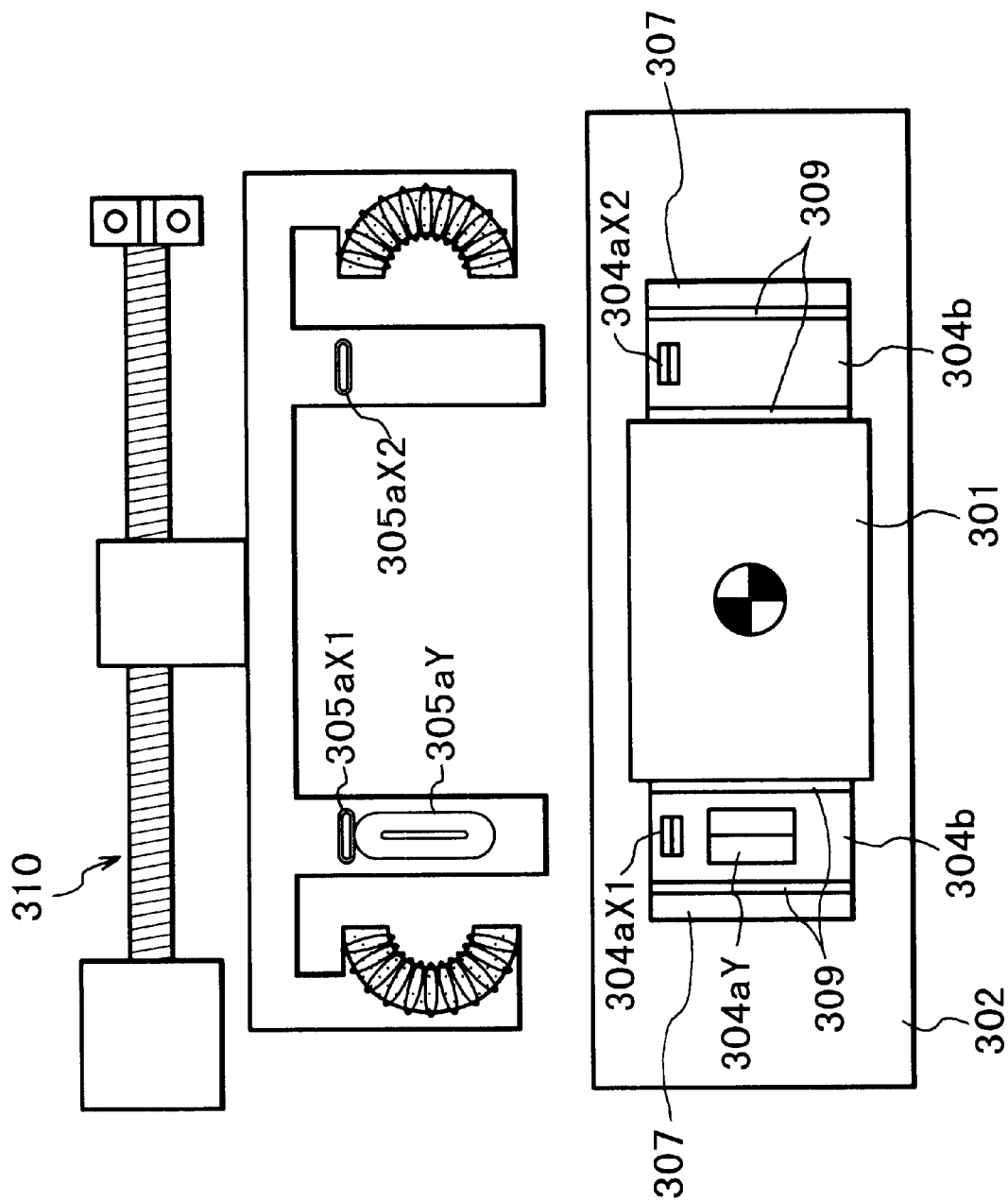
FIG. 6 is a schematic view of a modified example of the stage system of the third embodiment.

Simple control of the stage with respect to three axes needs only three coils such as X1, X2 and Y (FIG. 6), and it is sufficient that the line of action of the coil Y as well as the center line of the lines of action of the coils X1 and X2 pass through the stage gravity center. With such structure, however, the symmetry of mass about X axis. Y axis and rotational axis is destroyed, and the geometrical center is not registered with the gravity center. It is therefore necessary to use additional coils and corresponding moving magnets so that the stage mass distribution becomes symmetrical. Thus, for symmetrical mass distribution, as shown in FIG. 5, six coils may preferably be disposed symmetrically. However, disposition of coils is not limited to this.

The coils X1 and X2 are driven by one and the same driver. The coils X3 and X4 are driven by one and the same driver. The coils Y1 and Y2 are driven by one and the same driver. Thus, as the freedom of force acting on to the stage 301, there are three degrees of freedom, in X, Y and θ directions.

While in the preceding embodiment a pair of electromagnets are disposed on the opposite sides of a magnetic material plate, in this embodiment there are two, front and rear magnetic material plates 307 disposed along Y direction, and also a pair of electromagnets 308 are provided to sandwich the stage as a whole therebetween. This is to keep the symmetry of mass distribution of the stage 301, and to facilitate the control calculation.

Further, while in the second embodiment the linear motor stator moving feed screw and the electromagnet moving feed screw are provided separately, in this embodiment the linear motor stator and the electromagnet are held by a common supporting frame, for simplification of structure.

The linear motor means 303 of three-axis control system such as described above may preferably be made to operate to apply forces to the stage 301 at least at two sides of the stage or from two locations. In the example of this embodiment, forces are applied to the stage from two opposite sides thereof. If forces in three-axis directions are produced from only one side, either one of the lines of action of X and Y directions of translation will not pass through the stage gravity center. Therefore, a rotational force will be produced in the stage, and it needs correcting rotational force to suppress the same.

Figure 7:
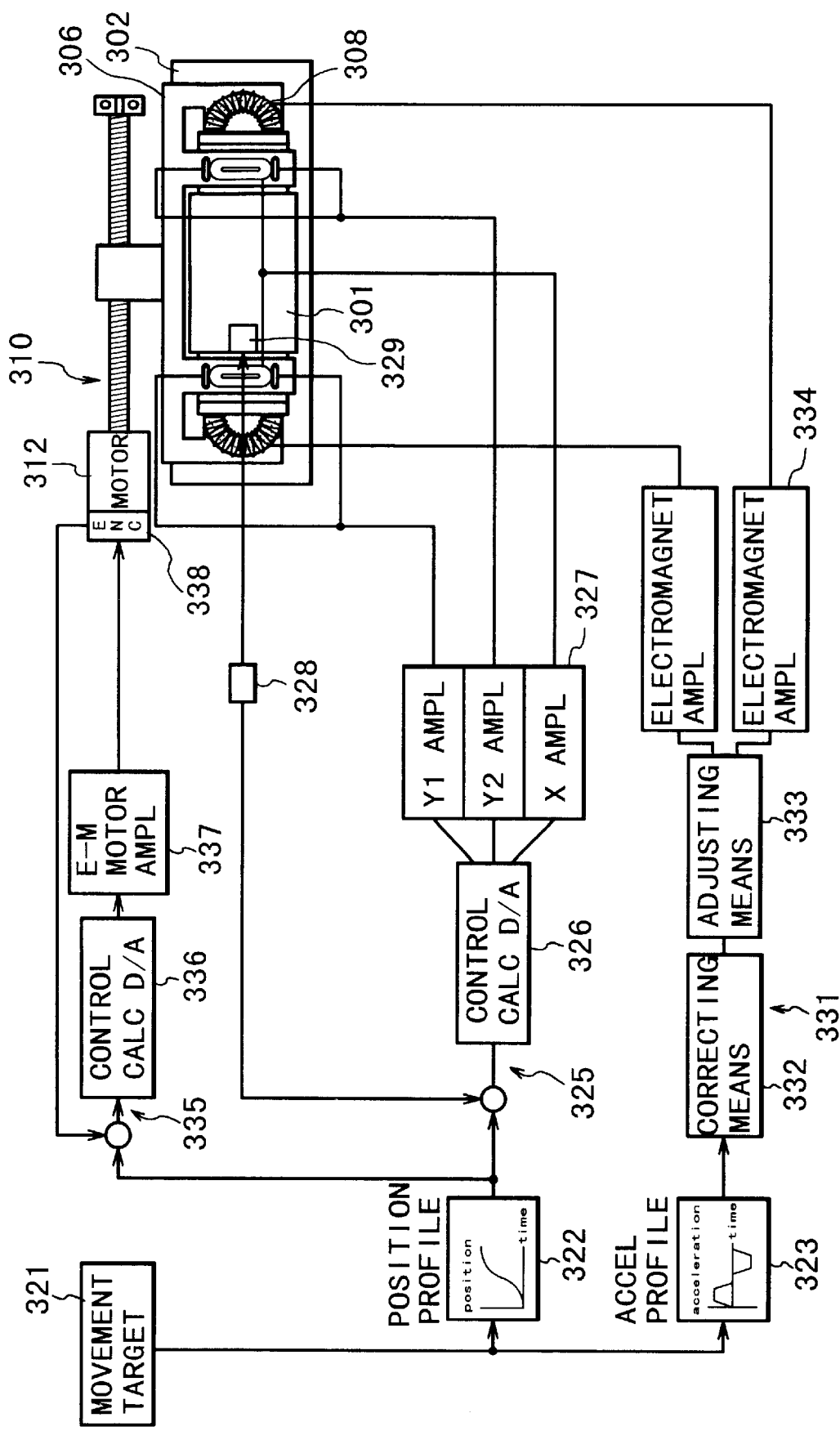
FIG. 7 is a block diagram of a control system in the stage system of the third embodiment.

FIG. 7 is a block diagram of a control system for drive controlling the stage system. It comprises movement target specifying means 321 for creating a movement target for the stage, position profile producing means 322 for generating the relationship between the time and the stage target position corresponding to that time, on the basis of the created target, and acceleration profile producing means 323 for generating the relationship between the time and the acceleration to be provided during that time, on the basis of the created target.

The output of the position profile producing means 322 is applied to a fine-motion linear motor position servo system 325 for controlling a fine-motion linear motor 303 and to a movement feedback (FB) system 335 for feedback controlling the motor 312 of the feed screw system 310, for moving in Y direction the supporting frame 306 which holds the linear motor stator 305 and the electromagnets 308. The output of the acceleration profile producing means 323 is applied to an attraction feed-forward (FF) system 331 for feed-forward controlling the attraction force of the electromagnet 308.

The fine-motion linear motor position servo system 325 comprises calculating means 326, a motor current amplifier 327. A linear motor 303 and an interferometer 328. The calculating means 326 operates to perform control calculation, typically such as PID. For example, to a difference between a current target position (X, Y and θ positions) of the stage as specified by the position profile producing means 322 and the current position (X, Y and θ positions) of the stage 301 as measured by the interferometer 328. The result of calculation is applied, as an analog voltage, to the amplifier 327. The motor current amplifier 327 is a fine-motion current amplifier for supplying an electric current, proportional to the produced analog output voltage, to each of the linear motors Y1 and Y2, linear motors X1 and X2, and linear motors X3 and X4. The linear motor means 303 has a structure such as described above, and, in response to the supplied current, it applies a thrust to the stage 301. The interferometer 328 serves to measure the position of a reflection mirror 329 mounted on the stage 301, and thus to measure the position (X, Y and θ positions) of the stage (or a moving element provided integrally with the stage). In FIG. 7, while the measurement of the interferometer 328 is depicted by a single measurement line, in practice, measurements in three axes are performed. Usually, a three-axis interferometer having two beams in Y direction and one beam in X direction may be used.

The correcting means 332 functions to correct non-linear relationship between the electric current and attraction force of the electromagnet, and it includes a square root calculator. Generally, the attraction force of an electromagnet is proportional to a square of the electric current to the electromagnet. The attraction force to be produced to drive the stage is a force which is proportional to the output of the acceleration profile producing means. Therefore, once the square root of the output of the acceleration profile producing means is detected and it is taken as a designating signal, an attraction force proportional to the square of the square root of the output of the acceleration profile producing means can be produced. Namely, an attraction force proportional to the output of the acceleration profile producing means is provided. Also, since the sign of the output of the acceleration profile producing means 323 may be either positive or negative, the square root calculation may be made to an absolute value of the output and, after the calculation, the sign may be specified when the result is applied to the adjusting means 332.

The adjusting means 333 serves to adjust attraction forces functioning between the paired electromagnets 308 and the magnetic material plates 307, so that these forces are combined into a force of desired magnitude and orientation. Regardless of the direction of electric current, the electromagnet can produce only a force for attracting the magnetic material plate. In consideration of it, a pair of electromagnets are placed to sandwich the stage therebetween in Y direction, so that these electromagnets produce and apply opposite forces to the magnetic material plates opposed to them, respectively. By adjusting these two forces, the magnitude and orientation of a combined force acting on the magnetic material plates is controlled. One convenient control procedure may be that: in accordance with the sign of the output of the correcting means 332 described above, one of the paired electromagnets to which the electric current is to be applied is selected, and a value proportional to the output of the correcting means 332 is applied to the current amplifier 334 while the electric current to the other electromagnet is kept null. If the output of the correcting means is null, the electric current to both electromagnets is controlled to be null. As a result of this, a thrust which is proportional to the output of the acceleration profile producing means is applied from the paired electromagnets 208 to the magnetic material plates, in a desired direction.

Bias electric currents of the same level mas be applied to the two electromagnets when the output of the correcting means is null. This provides an effect that the relation between the current and the operation center of BH curve of the electromagnet, that is, the relation between the strength of magnetic field and the magnetic density becomes more linear. The correcting means and the adjusting means may then function integrally to designate, in response to the output of the acceleration profile, appropriate currents for the two electromagnets. More specifically, if the output of the acceleration profile producing means in the positive movement direction is Va, the bias current is Ib. The electromagnet coil current for producing an attraction force in the positive movement direction is Ib, the electromagnet coil current for producing an attraction force in the negative movement direction is Im, then, for a predetermined proportional constant K, the Ip and Im satisfying a relation Va=Kt[(Ip−Ib)$^2$−(Im−Ib)$^2$] may be outputted.

The attraction force of an electromagnet can produce large thrust with a small ampere-turn as compared with the Lorentz force of a linear motor. Thus, as compared with heat generation during acceleration and deceleration of a stage only by using a linear motor, heat generation of electromagnet is very small and it does not cause any inconvenience.

During constant speed motion, the electric currents to the electromagnets are controlled to be null. Thus, any external disturbance such as floor vibration is not transmitted to the stage system through the electromagnets. In this state, only the fine-motion linear motor controls the stage at high precision.

The movement feedback (FB) system 335 functions to cause the position of the supporting frame 306 to move and follow the position profile. In the linear motor of this embodiment, the relative movement range of the stator and the moving element is short and, therefore, a force can not be applied to the moving element for a long distance. In this embodiment, in order to assure that the stage 301 is moved in Y direction through a long distance. The supporting frame for holding the linear motor stator 305 and the electromagnets 308 is made movable in Y direction by means of the feed screw driving system 310. As a result, throughout the movable stroke of the stage 301, a force can be applied to the stage 301 from the linear motor stator 305 and the electromagnets 308. In order to accomplish this, the position profile is inputted into the position control system having a feedback function based on an encoder of the motor, such that the supporting frame is moved by means of the motor and the feed screw in accordance with the position profile substantially the same as of the stage. By doing so, the relative position of the stator 305, the moving element 304, the electromagnet 308 and the magnetic material plate 307 can be held substantially constant.

The motor 312 should produce a torque for accelerating the supporting frame 306 and the nut 311 of the feed screw system 310. Further, it is undesirable that positional errors are accumulated in the position control system at the time of completion of acceleration. In consideration of this, in addition to the structure of FIG. 7, the output of the acceleration profile producing means may be added to the output of the control calculator and the sum may be inputted into the motor current amplifier. This enables designation of acceleration to the motor, like feed-forward control, such that stage acceleration can be performed without accumulation of positional errors. During position control or speed control for the stage after the acceleration period therefor, the screw feed system moves the supporting frame substantially at the same speed as the stage.

As described above, the stage is accelerated by means of a feed screw system and electromagnets, and, when the acceleration is completed, the electric currents to the electromagnets are made null, whereby floor vibration is isolated. Simultaneously therewith, by using the screw feed system, the positions of the electromagnets are controlled so that they are kept out of contact with the magnetic material plate. In parallel to these operations, the fine-motion linear motor performs position control constantly at high precision, and large thrust and low heat generation as well as high precision three-axis position control are accomplished at the same time.

In this embodiment, in view of the movement amount of linear motor stator and movement amount of electromagnet required for stage driving being substantially equal to each other, the stator and electromagnet are held by a common holding frame to be driven by one and the same driving mechanism. This effectively simplifies the structure of the stage system, and reduction in cost and size is attained.

Linear motors and electromagnets are provided symmetrically with respect to the gravity center of the stage, which accomplishes symmetry of mass distribution of the system. Therefore, no useless rotational force is produced during stage driving.

The advantageous results as attainable with the preceding embodiments are accomplished also in this embodiment.

While the foregoing embodiments have been described with reference to examples wherein the stage has a long stroke only in Y direction, a feed screw system may be provided to move the Y-axis driving feed screw system as a whole in X direction, while a flat guide of approximately square shape may be used, to provide long strokes in both of X and Y directions.

[Embodiment 4]

Figure 8:
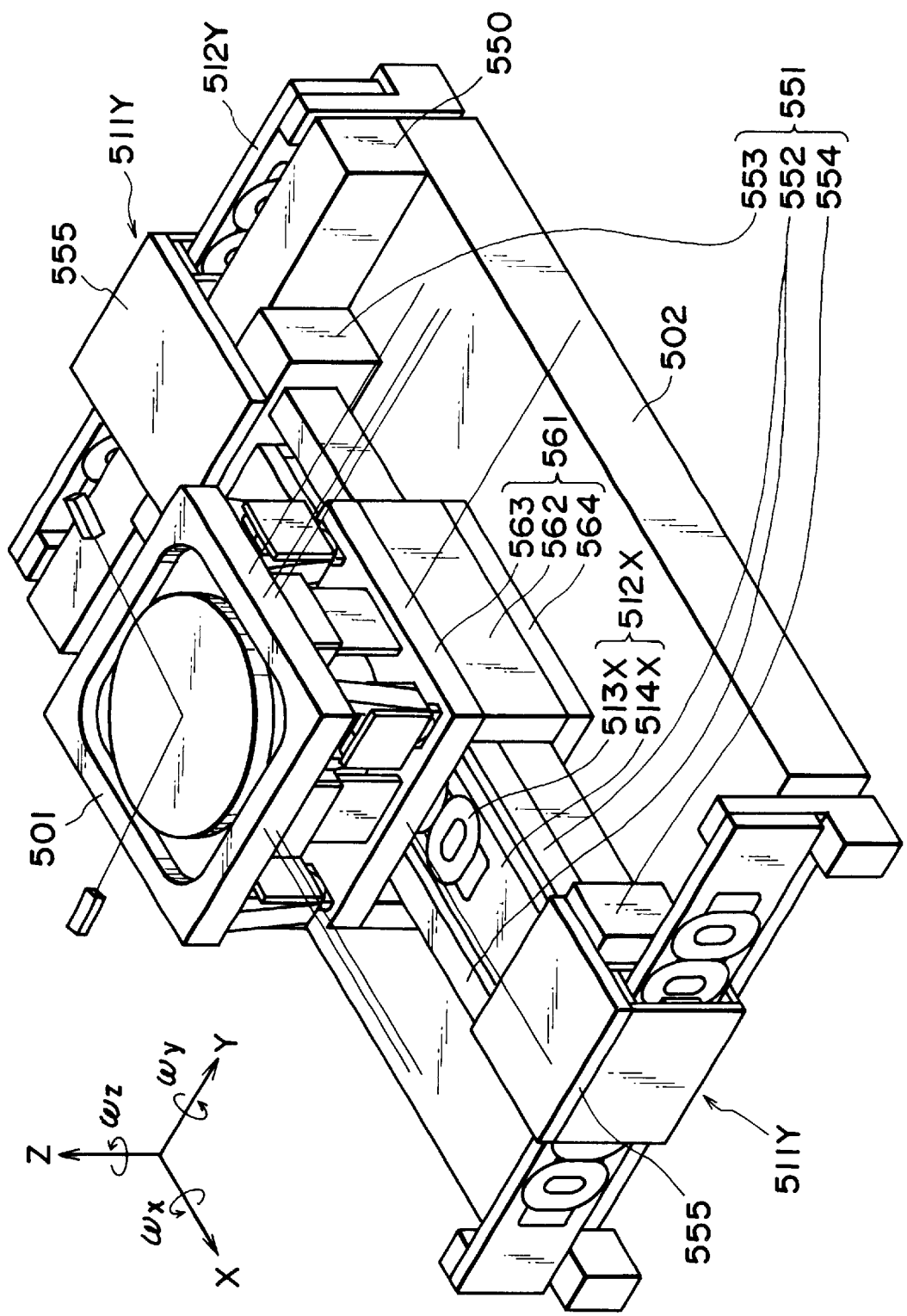
FIG. 8 is a perspective view of a wafer stage system according to a fourth embodiment of the present invention.

FIG. 8 is a perspective view of a fourth embodiment of the present invention, wherein a basic structure of the present invention is applied to a wafer stage system.

[Details of X-Y Stage]

There is a Y yaw guide 550 fixed to a base table 502. The side faces of the Y yaw guide 550 and the top face of the base table 502 function to guide a Y stage 551. The Y stage 551 is supported by an air slide (not shown) provided on the Y stage 551, slidably along Y direction.

The Y stage 551 mainly comprises four components of two X yaw guides 552, a large Y slider 553 and a small Y slider 554. The large Y slider 553 is disposed opposed to the side faces of the Y yaw guide 550 and the top surface of the base table 502, through air pads (not shown) provided on its side faces and bottom face. The small Y slider 554 is disposed opposed to the top face of the base table 502 through air pads (not shown) provided on its bottom face. With the structure described above, the Y stage as a whole is supported at the side faces of the Y yaw guide 550 and the top face of the base table 502, slidably in Y direction.

On the other hand, there is an X stage 561 mainly comprising four components of two X stage side plates 562, an upper X stage top plate 563 and a lower X stage bottom plate 564. These components are disposed to surround the X yaw guide 552 of the Y stage 551, around the X axis. The X stage 561 is supported by an air slide (not shown) slidably in X direction, and it is guided by the top face of the base table 502 and the side faces of the two X yaw guides 552 which are components of the Y stage 551. The X stage bottom plate 564 is disposed opposed to the top surface of the base table 502, through air pads (not shown) provided on its bottom face. The two X stage side plates 562 are disposed opposed to the side faces of the two X yaw guides 552 of the Y stage 551, through air pads (not shown) provided on their side faces. The bottom face of the X stage top plate 563 and the top face of the X yaw guide 552, and the top face of the X stage bottom plate 564 and the bottom face of the X yaw guide 552 are held out of contact with each other. Thus, the X stage 561 as a whole is supported by the side faces of the two X yaw guides 552 and the top face of the base table 502, slidably in X direction as described above. With this structure, the X stage 561 moves in Y direction together with Y-direction motion of the Y stage 551 while on the other hand it is movable in X direction relatively to the Y stage 551. Thus, it is made slidable two-dimensionally along X and Y directions.

The driving mechanism for the X-Y stage (moving mechanism) comprises one long-range linear motor (for X driving) and two long-range linear motors (for Y driving), each being of multiple-phase coil interchanging type. The X linear motor 510X for X driving has a stator 512X provided on the Y stage 551 and a moving element 511X provided on the X stage 561. They operate to produce a driving force between the X stage 561 and the Y stage 551. The Y linear motors 510Y for Y driving have stators 512Y which may be provided integrally with the base table 502, or they may be provided on a member which is isolated from the base table with respect to vibration. The Y linear motors 510Y have moving elements 511Y being made integral with the Y stage 551 through connecting plates 555. With this structure, the Y linear motors 510Y for Y driving function to move the Y stage 551 in Y direction, relatively to the base table 502.

Each stator 512 of linear motor 510 has plural coils 513 arrayed along the stroke direction and being held by a coil holding frame 514. Each moving element 511 of linear motor 510 has four-pole magnets with a magnetic pole pitch corresponding to the coil span of the coils and being arrayed on a yoke plate, and it is provided by box-like magnets formed to be opposed to sandwich the coils. In this long-range linear motor, an electric current is selectively applied to the stator coils in accordance with the position of the moving element, whereby a thrust is produced.

[Details of Wafer Top Plate 501]

The wafer top plate 501 (movable stage) has a wafer chuck 571 on which a wafer (workpiece) is to be placed, and it serves to perform wafer positioning with respect to six freedom directions of translational X, Y and Z directions and rotational wx, wy and wz directions. The wafer top plate 501 has a rectangular shape, and there is a recess 572 formed at its center. The wafer chuck 571 for carrying a wafer thereon is disposed in the recess 572. Mounted on side faces of the wafer top plate 501 are mirrors 529 for reflecting laser light of interferometers (first measuring means), for measurement of the position of the wafer top plate 501.

[Details of Position Measurement]

Figure 9:
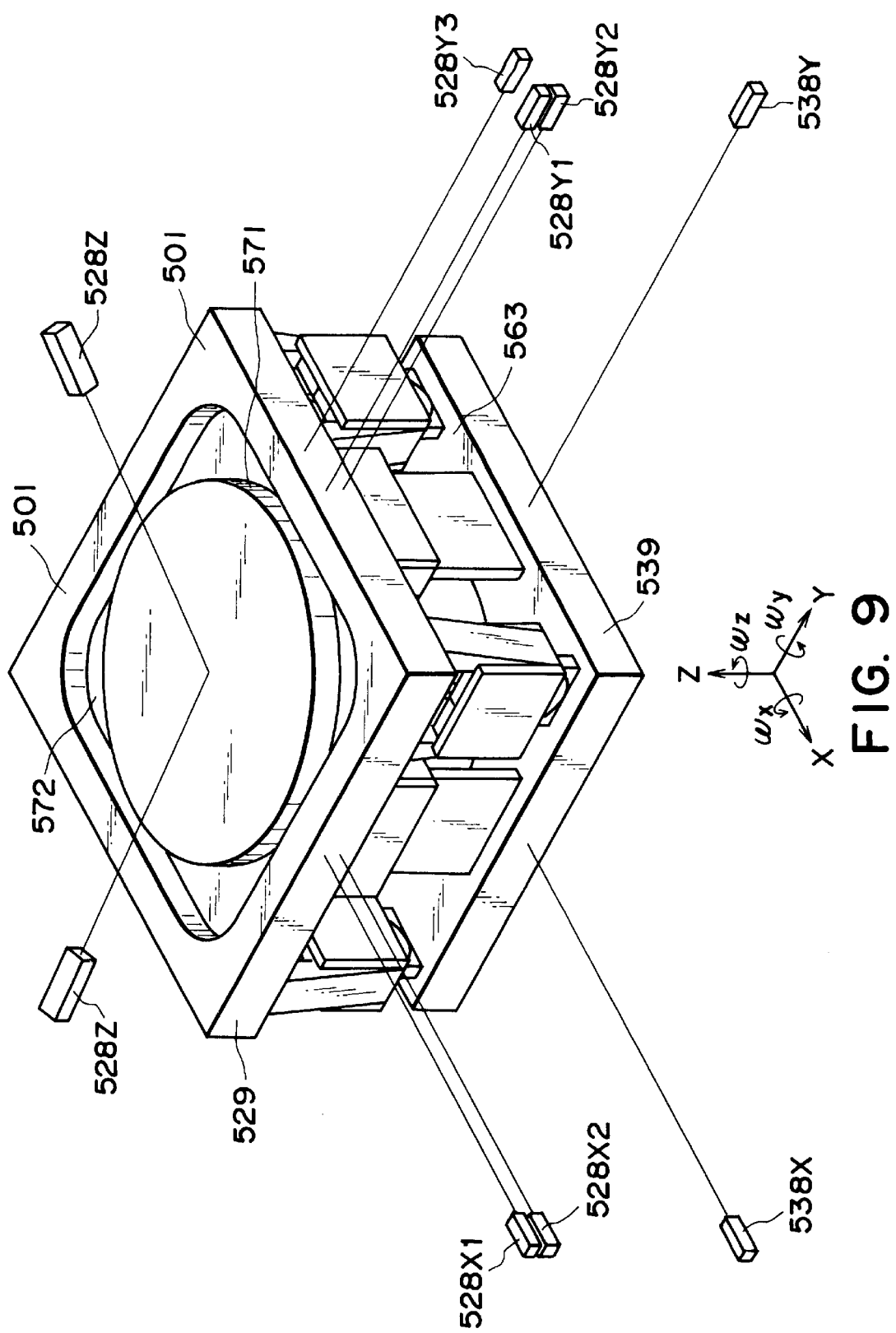
FIG. 9 is a schematic view for explaining measuring means for the wafer stage system of the fourth embodiment.

Referring now to FIG. 9, measurement of position of the X stage 561 and measurement of position of the wafer top plate 501 will be explained.

Formed on side faces of the top plate 563 of the X stage 561 are mirrors for reflecting measurement light of interferometers (second measuring means) for performing position measurement to the X stage 561. More specifically, measurement lights from laser interferometers are projected onto the mirrors 539 at the X stage side faces along X and Y directions, such that the position of the X stage 561 with respect to X and Y directions can be measured precisely through the laser interferometers.

There are mirrors 529 for reflecting laser beams of laser interferometers, formed on side faces of the wafer top plate 501, such that the position of the wafer top plate 501 can be measured. Six light beams are projected onto the wafer top plate 501, such that the position of the wafer top plate 501 with respect to six freedoms can be measured. By using two interferometer beams which are parallel to X axis and are different in Z position, the position of the wafer top plate 501 with respect to X direction as well as the rotational amount thereof in wy direction can be measured. Also, by using three interferometer beams which are parallel to Y axis but are different in X and Z positions, the position with respect to Y direction as well as the rotational amount in wx and wy directions can be measured. Further, by projecting a measurement light obliquely onto a wafer placed on the wafer chuck 571 and by measuring the reflection position of the measurement light, the position of the wafer in Z direction (i.e., the position of the wafer top plate in Z direction) can be measured.

Thus, on the basis of measurements of the positions of the X stage 561 and the wafer top plate 501 as described above, the position measurement to the X stage 561 and the position measurement to the wafer top plate 501 can be performed independently of each other, by which their positions can be measured very precisely through laser interferometers.

[Details of Fine-Motion Actuator]

Figure 10:
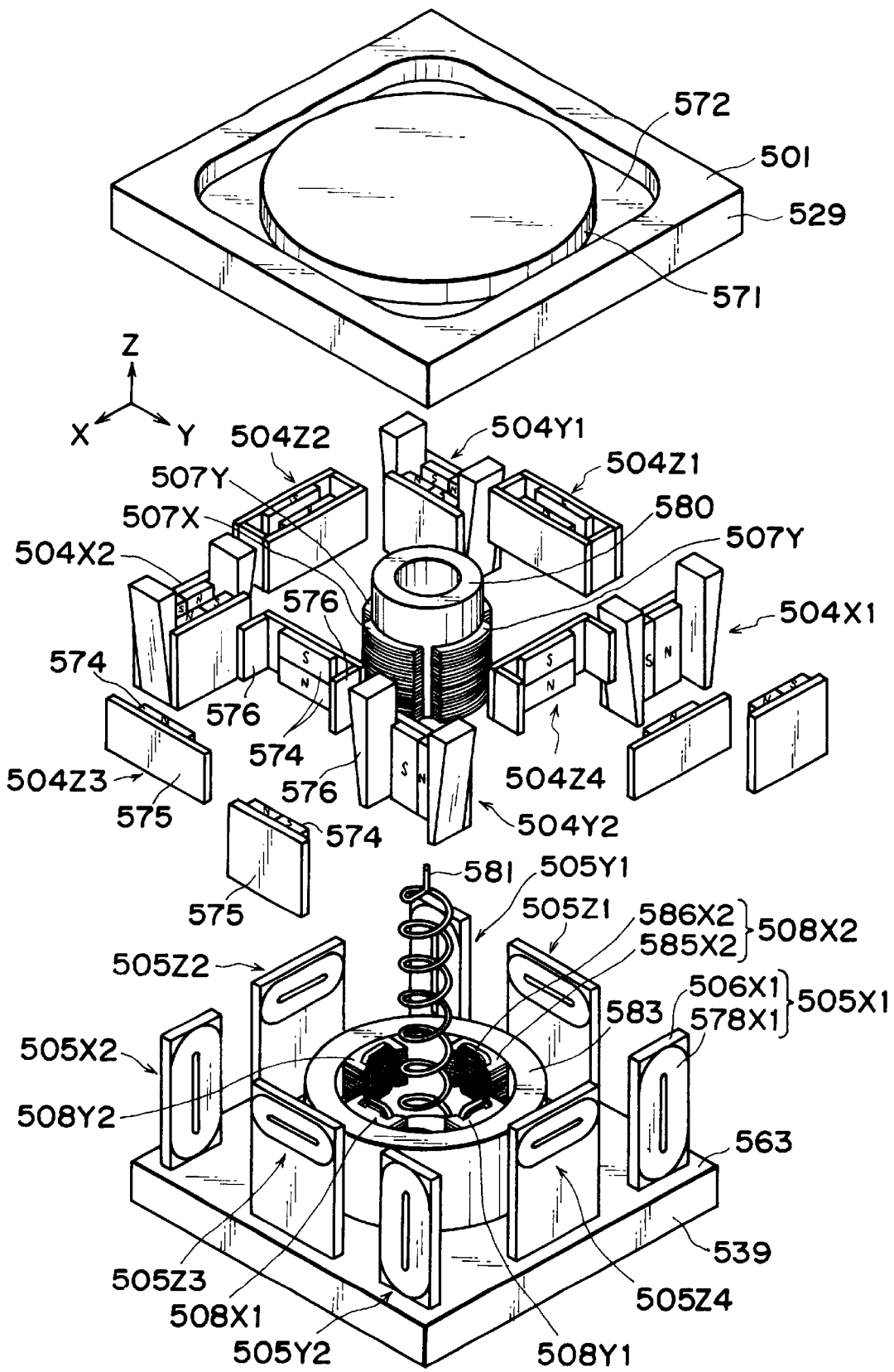
FIG. 10 is an exploded view of the wafer stage system of the fourth embodiment.

Referring now to FIG. 10, a fine-motion actuator unit for producing a driving force between the X stage 561 and the wafer top plate 501, will be explained. FIG. 10 is an exploded view of actuator means between the X stage 561 and the wafer top plate 501, which comprises a fine-motion linear motor 503 and an electromagnet 508, for example.

Disposed below the wafer top plate 501 is the X-Y stage described above, which provides a reference for application of thrust or attraction force to the wafer top plate 501.

Mounted on the bottom face of the wafer top plate 501 are eight linear motor moving elements 504. Each moving element 504 has two sets of dual-pole magnets 574, being magnetized in its thickness direction, and yokes 575. These two sets of magnets 574 and yokes 575 are mutually connected by means of side plates 576, whereby a box-like structure is provided such that linear motor stators 505 (to be described later) are surrounded by them without contact thereto.

Four moving elements 505Z of the eight moving elements 504 are disposed approximately at the center of the sides of the rectangular top plate 501, and they provide a Z moving element for minutely (fine-motion) moving the wafer top plate 501 in Z direction, relatively to the X stage 561. In this Z moving element 505Z, the dual-pole magnet 574Z is disposed along Z direction, such that, through interaction with the electric current flowing through an elongated ring-like coil 578Z of the Z stator 505Z having a straight portion normal to Z direction, a thrust in Z direction is produced. Here, they are called moving elements Z1–Z4.

Two moving elements of the remaining four moving elements 504X, which are placed at diagonal corners of the rectangular top plate, provide an X moving element for minutely (fine-motion) moving the wafer top plate 501 in X direction, relatively to the X stage 561. In the X moving element 504X, the dual-pole magnet 574 is disposed along X direction, such that, through interaction with the electric current flowing through an elongated ring-like coil 578X of the X stator 505X having a straight portion normal to X direction, a thrust in X direction is produced. Here, they are called moving elements X1 and X2.

The remaining two moving elements 504Y are also disposed at the diagonal corners of the rectangular top plate 501, and they provide Y moving element for minutely (fine motion) moving the wafer top plate 501 in Y direction, relatively to the X stage 561. In the Y moving element 504Y, the dual-pole magnet 574 is disposed along the Y direction, such that, through interaction with the electric current flowing through the elongated ring-like coil 578Y of the Y stator 505Y having a straight portion perpendicular to Y direction, a thrust in Y direction is produced. Here, these moving elements are called moving elements Y1 and Y2.

Also, at about the center of the rectangular shape of the bottom face of the wafer top plate 501, there is a magnetic material supporting cylinder 580 of cylindrical shape. There are four magnetic material blocks 507 of arcuate shape, fixed to the outside circumferential portion of the supporting cylinder 580. Two (507X) of these magnetic material blocks 507 are disposed along X direction, and they are opposed to electromagnets 508X of E-shape also disposed along X direction, without contact thereto. Thus, these blocks can receive a large attraction force in X direction from the E-shaped electromagnets 508X. Here, the magnetic material blocks 507X of arcuate shape, being disposed along X direction, are called blocks X1 and X2.

The remaining two magnetic blocks 507Y of arcuate shape are disposed along Y direction, and they are opposed to electromagnets 508Y of E-shape also disposed along Y direction, without contact thereto. Thus, these blocks can receive a large attraction force from the electromagnets 508Y. Here, the magnetic blocks 507Y disposed along Y direction are called blocks Y1 and Y2.

Disposed inside the central hollow portion of the supporting cylindrical member 580 of magnetic material is a weight compensating spring 581 which has its top end connected to the center of the bottom face of the wafer top plate 501, to support the weight of the wafer top plate 501. The weight compensation spring 581 is designed to provide very small spring constants with respect to the weigh supporting direction and other five freedom directions. Thus, transmission of vibration from the X stage 561 to the wafer top plate 501 through the spring 581 can be disregarded.

The Z coordinates of the lines of action of the forces to be produced by the moving elements X1 and X2 (504X) are approximately registered with each other, and also they are approximately registered with the Z coordinate of the gravity center of the wafer top plate 501, including the four magnetic material blocks 507, magnetic material cylinder 580, moving elements Z1, Z2, Z3 and Z4 (504Z), moving elements Y1 and Y2 (504Y) and moving elements X1 and X2 (504X). As a result, in response to the thrust in X direction produced in the moving elements X1 and X2 (504X), substantially no rotational force about Y axis acts on the wafer top plate 501.

The Z coordinates of the lines of action of the forces to be produced by the moving elements Y1 and Y2 (504Y) are approximately registered with each other, and also they are approximately registered with the Z coordinate of the gravity center of the wafer top plate 501, including the four magnetic material blocks 507, magnetic material cylinder 580, moving elements Z1, Z2, Z3 and Z4 (504Z), moving elements Y1 and Y2 (504Y) and moving elements X1 and X2 (504X). As a result, in response to the thrust in Y direction produced in the moving elements Y1 and Y2

(504Y), substantially no rotational force about X axis acts on the wafer top plate 501.

The Z coordinates of the lines of action of the attraction forces to be applied to the magnetic blocks X1 and X2 (507X) are approximately registered with each other, and also they are approximately registered with the Z coordinate of the gravity center of the wafer top plate 501, including the four magnetic material blocks 507, magnetic material cylinder 580, moving elements Z1, Z2, Z3 and Z4 (504Z), moving elements Y1 and Y2 (504Y) and moving elements X1 and X2 (504X). As a result, in response to the attraction force in X direction applied to the blocks X1 and X2 (507X), substantially no rotational force about Y axis acts on the wafer top plate 501.

The X coordinates of the lines of action of the attraction forces to be applied to the magnetic blocks X1 and X2 (507X) are approximately registered with the X coordinate of the gravity center of the wafer top plate 501, including the four magnetic material blocks 507, magnetic material cylinder 580, moving elements Z1, Z2, Z3 and Z4 (504Z), moving elements Y1 and Y2 (504Y) and moving elements X1 and X2 (504X). As a result, in response to the attraction force in X direction applied to the blocks X1 and X2 (507X), substantially no rotational force about Z axis acts on the wafer top plate 501.

The Z coordinates of the lines of action of the attraction forces to be applied to the magnetic blocks Y1 and Y2 (507Y) are approximately registered with each other, and also they are approximately registered with the Z coordinate of the gravity center of the wafer top plate 501, including the four magnetic material blocks 507, magnetic material cylinder 580, moving elements Z1, Z2, Z3 and Z4 (504Z), moving elements Y1 and Y2 (504Y) and moving elements X1 and X2 (504X). As a result, in response to the attraction force in Y direction applied to the blocks Y1 and Y2 (507Y), substantially no rotational force about X axis acts on the wafer top plate 501.

The X coordinates of the lines of action of the attraction force in Y direction applied to the magnetic blocks Y1 and Y1 (507Y) are approximately registered with the X coordinate of the gravity center of the wafer top plate 501, including the four magnetic material blocks 507, magnetic material cylinder 580, moving elements Z1, Z2, Z3 and Z4 (504Z), moving elements Y1 and Y2 (504Y) and moving elements X1 and X2 (504X). As a result, in response to the attraction force in Y direction applied to the blocks Y1 and Y2 (507Y), substantially no rotational force about Z axis acts on the wafer top plate 501.

On the other hand, mounted on the top of the X stage top plate 563 are stators 505 of eight fine-motion linear motors 503 for performing position control of the wafer top plate 501 with respect to six axial directions, as well as four E-shaped electromagnets 508 being supported by an electromagnet supporting cylinder 505, for applying acceleration in X and Y directions to the wafer top plate 501. An end of the weight supporting spring for supporting the weight of the wafer top plate 501 is connected to there.

Each stator 505 has a structure that an elongated ring-like coil 578 is supported by a coil holding frame 579. It is disposed opposed to the linear motor moving element 504, fixed to the bottom face of the wafer top plate 501, without contact thereto.

Four stators 505Z of the eight stators 505 are disposed approximately at the center of the sides of the rectangular X stage top plate 563, and they provide a Z stator for minutely (fine-motion) moving the wafer top plate 501 in Z direction, relatively to the X stage 561. In this Z stator 505Z, a straight portion of the elongated ring-like coil 578Z is disposed to be perpendicular to Z direction, such that a thrust in Z direction can be applied to the dual-pole magnet 574Z of the Z moving element 504Z disposed along Z direction. Here, these coils are called coils Z1–Z4.

Two stators 505X of the remaining four stators are are placed at diagonal corners of the rectangular top plate 563, and they provide an X stator. In this X stator 505X, two straight portions of the elongated ring-like coil 578X are perpendicular to X direction, and two straight portions extend along X direction. Thus, a thrust in X direction can be applied to the dual-pole magnet 574X of the X moving element 504X, disposed along X direction. Here, these coils are called coils X1 and X2.

The remaining two moving elements 505Y are also disposed at the diagonal corners of the rectangular top plate 563, and they provide Y stator. In this Y stator 505Y, two straight portions of the elongated ring-like coil 578X are perpendicular to Y direction, and two straight portions extend along Y direction. Thus, a thrust in Y direction can be applied to the dual-pole magnet 574Y of the Y moving element 504Y, disposed along Y direction. Here, these coils are called coils Y1 and Y2.

Also, at about the center of the rectangular shape of the X stage top plate 563, there is an electromagnet supporting cylinder 583. Disposed inside the supporting cylinder 583 are four E-shaped electromagnets 508. These electromagnets 508 have magnetic material blocks 585 of approximately E-shaped section as viewed in Z direction, and coils 586. The coil 585 is wound around a central protrusion of the E-like shape. The end faces of the three protrusions of the E-like shape are formed into arcuate shape, not straight. These end faces of the three protrusions of the E-shaped electromagnet 508 are disposed opposed to the arcuate magnetic material blocks 507, fixed to the wafer top plate 501, through a clearance of a several ten microns and without contact thereto. In response to application of electric current to the coil, an attraction force is applied to the magnetic material block 585.

Two of the four electromagnets 508 are disposed along X direction and they are opposed to the blocks X1 and X2 (507X), such that attraction forces in X direction and –X direction are applied to the blocks X1 and X2 (507X), respectively. Here, they are called electromagnets X1 and X2.

The remaining two electromagnets 508 are disposed to be opposed to the blocks Y1 and Y2 (507Y), such that attraction forces in Y direction and –Y direction are applied to these blocks Y1 and Y2, respectively. Here, they are called electromagnets Y1 and Y2.

Since the electromagnet 508 can produce attraction force only, in regard to each of the driving directions of X and Y, electromagnets for producing attraction forces in positive and negative directions, respectively, are provided.

The opposed faces of the magnetic material blocks 507 and the E-shaped electromagnets are defined by portions of a cylindrical face, so that the four magnetic material blocks and the four electromagnets can rotate freely about Z axis (in wx direction), without contact to each other. Namely, the wafer top plate 501 and the X stage 561 are made relatively movable in wx direction. Further, with rotation in wx direction, there occurs no change in clearance between the end face of the electromagnet 508 and the block 507. Thus, for the same electric current, the attraction force to be produced by the electromagnet 508 does not change.

While in this embodiment the opposed faces of the four magnetic blocks and the four E-shaped electromagnet are defined along a cylindrical face, the shape of the opposed faces is not limited to this. A spherical shape or cup-like shape may be used. Even if the opposed faces of the magnetic blocks and electromagnets are defined along a spherical shape or cup-like shape, it allows relative rotation with respect to three rotational directions of wx, wy and wz. Relative rotation does not cause a change in clearance of opposed faces, and the attraction force of the electromagnet does not change.

Each of the arcuate magnetic blocks 507 and the E-shaped magnetic blocks 585 is provided by laminating thin plates which are electrically isolated from each other. This effectively prevents flow of eddy current inside the block, due to a change in magnetic flux. Thus, the attraction force of the E-shaped electromagnet 508 can be controlled, up to high frequency.

With the structure described above, thrust can be applied by the linear motor in six axial directions, from the X stage 561 to the wafer top plate 501, and a large attraction force can be applied in X and Y directions by means of the electromagnet 508.

While long-stroke motion is unnecessary in translational Z direction and in rotational wx, wy and wz directions, the thrust or attraction force has to be applied through a long stroke in regard to X and Y directions. Since however both the linear motor 503 and the electromagnet 508 have a very short stroke in X and Y directions whereas the X stage 561 has a long stroke in X and Y directions, the thrust or attraction force is applied to the wafer top plate 501 while moving the X stage 561 in X and Y directions. This assures that the thrust or attraction force in X and Y directions is applied to the wafer top plate 501, throughout the length in X and Y directions.

[Details of Control System]

Figure 11:
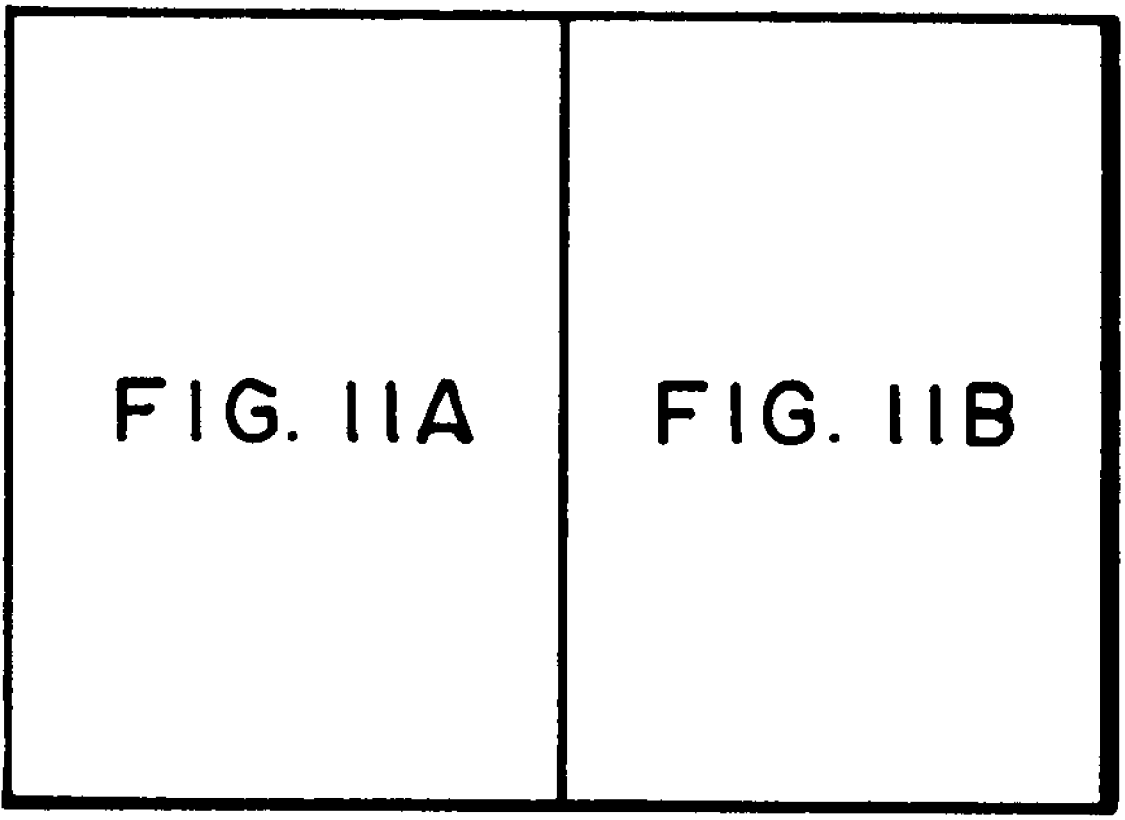
FIG. 11, which includes
Figure 11A:
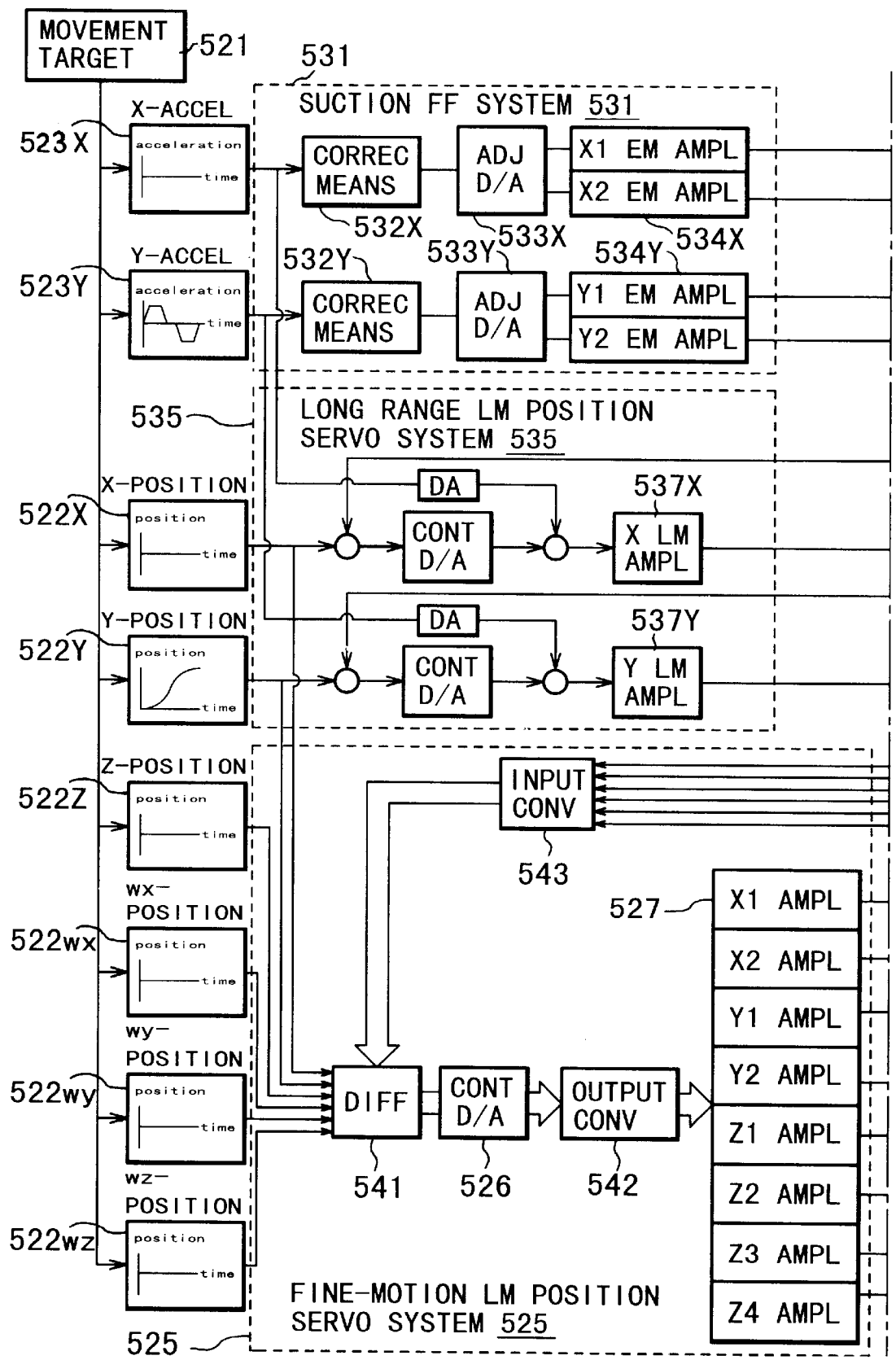

FIG. 11 is an example of control diagram for performing long-distance motion only in Y direction while a current position is held with regard to the other five directions.

Movement target designating means 521 produces and applies a target value of the wafer top plate 501, such as positions in respect to six directions, to position profile producing means 522 and acceleration profile producing means 523. The position profile producing means 522 creates the relationship between the time and the position of the wafer top plate 501 to be assumed, in respect to each of the six directions of translational X, Y and Z directions and rotational wx, wy and wz directions, on the basis of the target value outputted from the target designating means 521. The acceleration profile producing means 523 generates the relationship between the time and the acceleration to be produced, in respect to two axes of translational X and Y directions, on the basis of the target value outputted from the target designating means 521. These profiles are given with respect to a representative position of the wafer top plate 501 which is being taken as a rigid member. As such representative position, generally the gravity center of the wafer top plate 501 may be used.

Namely, in the case of this embodiment, the relationship between the time and the position to be assumed by the gravity center of the wafer top plate 501 as well as the rotation about the gravity center is provided by the position profile producing means 522, while the acceleration profile for the gravity center of the wafer top plate 501 in respect to X and Y directions is provided by the acceleration profile producing means.

Since in this embodiment long-distance motion is made only in Y-axis direction, a position profile for movement to the target position is produced only in relation to the Y axis.

As regards the remaining axes, a position profile of constant value for holding the current position is provided. As regards the acceleration profile, similarly, acceleration and deceleration profile in regard to the Y axis is produced by the acceleration profile producing means. As regards X axis along which motion is not produced, there is no profile.

The output of the position profile producing means 522, related to the gravity center position of the wafer top plate 501 in six axes as well as rotation about the gravity center, is applied to a fine-motion linear motor (LM) position servo system for controlling the fine-motion linear motor 503. More specifically, the output of gravity center X position profile producing means 522X and the output of Y position profile producing means 522Y are applied also to a long-range linear motor (LM) position servo system 535 for feedback controlling the electric current to the long-distance linear motor 510 of the X-Y stage, for moving the X stage 561 in X and Y directions.

The output of X acceleration profile producing means 523X and the output of Y acceleration profile producing means 523Y are applied to an attraction feed-forward (FF) system 531, for feed-forward controlling the attraction force of the electromagnet 508.

The fine-motion linear motor (LM) position servo system 525 comprises differentiating means 541, calculating means 526, output coordinate converting means 542, a fine-motion current amplifier 527, wafer top plate position measuring system 528, and an input coordinate converting means 543. The differentiating means 541 serves to produce a difference between the current target position (X, Y, Z, wx, wy, wz positions) to be currently assumed by the wafer top plate 501, as specified by the position profile producing means 522, and the current position or measured position (X, Y, Z, wx, wy and wz positions) as practically assumed by the wafer top plate 501. On the basis of a differential signal from the differentiating means 541, the calculating means 526 performs control calculation as represented by PID, for example, to calculate driving amounts in six axes. The output coordinate converting means 542 performs calculation for distributing driving amounts in six axes to linear motors 503 (X1, X2, Y1, Y2, Z1, Z2, Z3 and Z4), and the results of calculation are produced in analog voltages. The fine-motion current amplifier 527 supplies electric currents, proportional to the analog voltages, to the linear motors 503 (X1, X2, Y1, Y2, Z1, Z2, Z3 and Z4). The wafer top plate position measuring system includes the aforementioned measuring means with interferometers, for example, for measuring the position (X, Y, Z, wx, wy, wz) approximately at the exposure point of the wafer top plate 501. In accordance with the signal from the wafer top plate position measuring system, the input coordinate converting means 543 converts the position (X, Y, Z, wx, wy, wz) approximately at the exposure point of the wafer top plate 501 into the position (X, Y, Z, wx, wy, wz) of the gravity center of the wafer top plate 501.

The fine-motion linear motor (LM) servo system 525, when viewed in regard to each axis, is an ordinary position servo system which takes the output of the position profile producing means 522 as a designated value. When a large thrust is necessary, the attraction feed-forward (FF) system 531 to be described later produces the force. As described above, the attraction force of the electromagnet 508 is so arranged that the line of action thereof is registered with the gravity center of the wafer top plate 501, such that any rotational force is not produced in the wafer top plate 501. Therefore, what is required of the fine-motion linear motor 503 is to produce a small thrust for removing a small positional error with respect to the target position. Thus, no electric current causing large heat generation flows. The flow of electric current of linear motor may be restricted by hardware or software, such that, even if cooperation with the attraction feed-forward (FF) system 531 is out of order, flow of electric current causing heat generation is prevented.

The attraction feed-forward (FF) system 531 includes a control system for producing combined thrust in X direction, between the pair of electromagnets X1 and X2 (508X) and blocks X1 and X2 (507X), which thrust is proportional to the output of the acceleration profile producing means 523, as well as a control system for producing combined thrust in Y direction, between the pair of electromagnets Y1 and Y2 (508Y) and blocks Y1 and Y2 (507Y), which thrust is proportional to the output of the acceleration profile producing means 523. Each control system comprises correcting means 532, adjusting means 533 and two electromagnet current amplifiers 534 for energizing the coils 586 of the pair of electromagnets 508, independently of each other.

The correcting means 532 functions to correct non-linear relationship between the electric current and thrust of the electromagnet 508. In many cases, it comprises a square root calculator with a sign preserving function. Generally, the attraction force of an electromagnet is proportional to a square of the electric current to the electromagnet. Since the required attraction force is a force proportional to the output of the acceleration profile producing means 523, once the square root of the output is detected and is taken as a designating signal, an attraction force proportional to the square of the square root of the output of the acceleration profile producing means 523 can be produced. Namely, an attraction force proportional to the output of the acceleration profile producing means 523 is provided. Also, while the output of the acceleration profile producing means 523 bears the sign, the square root calculation may be made to an absolute value of the output and, after the calculation, the sign may be specified when the result is applied to the adjusting means.

The adjusting means 533 serves to adjust attraction forces functioning between the paired electromagnets 508 and the magnetic material 507, so that these forces are combined into a force of desired magnitude and orientation. Regardless of the direction of electric current, the electromagnet can produce only a force for attracting the magnetic material plate. In consideration of this, a pair of electromagnets 508 are placed to sandwich the magnetic material 507 therebetween, so that these electromagnets produce and apply opposite forces to the magnetic material. By adjusting these two forces, the magnitude and orientation of a combined force acting on the magnetic material 507 is controlled. One convenient control procedure may be that: in accordance with the sign of the output of the correcting means 532 described above, one of the paired electromagnets 508 to which the electric current is to be applied is selected, and a value proportional to the output of the correcting means 532 is applied to the current amplifier 534 while the electric current to the other electromagnet 508 is kept null. If the output of the correcting means 532 is null, the electric current to both electromagnets is controlled to be null. As a result of this, a thrust which is proportional to the output of the acceleration profile producing means 523 is applied from the paired electromagnets 508 to the magnetic material 507, in a desired direction.

Bias electric currents of the same level may be applied to the two electromagnets 508 when the output of the correcting means 532 is null. This provides an effect that the relation between the current and the operation center of BH curve of the electromagnet, that is, the relation between the strength of magnetic field and the magnetic density becomes more linear. The correcting means 532 and the adjusting means 533 may then function integrally to designate, in response to the acceleration profile output, appropriate currents for the two electromagnets. More specifically, if the output of the acceleration profile producing means in the positive movement direction is Va, the bias current is Ib, the electromagnet coil current for producing an attraction force in the positive movement direction is Ip, the electromagnet coil current for producing an attraction force in the negative movement direction is Im, then, for a predetermined proportional constant K, the Ip and Im satisfying a relation $Va=K[(Ip-Ib)^2-(Im-Ib)^2]$ may be outputted.

The attraction force of an electromagnet can produce large thrust with a small ampere-turn as compared with the Lorentz force of a linear motor. Thus, as compared with heat generation during acceleration and deceleration of a stage only by using a linear motor, heat generation of electromagnet is very small and it does not cause any inconvenience.

During constant speed motion, the electric currents to the electromagnets 508 are controlled to null. Thus, any external disturbance such as floor vibration is not transmitted to the wafer top plate 501 through the electromagnets 508. In this state, only the fine-motion linear motor controls the positioning of the wafer top plate in six axes at high precision.

In this embodiment, since the fine-motion linear motor and electromagnets 508 connected to the wafer top plate 501 have a short stroke, a force can not be applied, through a long distance. In consideration of this, a thrust or attraction force in X and Y directions is applied to the wafer top plate 501 while moving, in X and Y directions, the X stage 561 for providing a reference for application of force to the wafer top plate. This accomplishes application of a thrust or attraction force in X and Y directions to the top plate 501, through a long distance along X and Y directions. In order to attain this, the long-range linear motor (LM) position servo system as well as two Y linear motors and one X linear motor, connected to the LM position servo system, are used.

The long-range linear motor (LM) position servo system 535 has an X control system and a Y control system. The X control system controls the X position of the X stage 561 by using one X linear motor, in accordance with the X position profile. The Y control system controls the Y positions of the Y stage 551 and X stage 561 by using two Y linear motors, in accordance with the Y position profile.

The X and Y control systems of the position servo system 535 serve to produce a difference between the X or Y position profile and the current position of the X stage 561 in X or Y direction as measured on the basis of an interferometer beam, projected to the reflection mirror mounted on the side face of the X stage top plate 563. Also, they operate to perform control calculation as represented by PID, for example, to this differential signal, so as to calculate acceleration value in X or Y direction. The result is applied to the X linear motor 510X or Y linear motor 510Y through the X or Y linear motor current amplifier 537.

With the structure described above, the Y linear motor 510Y produces a thrust for accelerating, in Y direction, the whole mass including Y stage 551, X stage 561 and wafer top plate 501, for example, and the X linear motor 51OX produces a thrust for accelerating, in X direction, the whole mass including X stage 561 and the wafer top plate 501, for example.

In this embodiment, the output of the acceleration profile producing means 522 is added to the output of the control calculator of the long-range linear motor (LM) position servo system, and the sum is applied to the motor current amplifier. By this, the acceleration signal is applied to the linear motor 510 like feed-forward control, thereby to prevent accumulation of positional error during acceleration.

In this embodiment, the acceleration profile is applied in feed-forward control to the attraction feed-forward (FF) system 531 and the long-range linear motor (LM) position servo system 535. In addition to it, the profile may be applied to the fine-motion linear motor (LM) position servo system 525 in feed-forward control. Further, the acceleration profile may be produced with respect to all the six axes, not only the X and Y directions, and they may be applied to the fine-motion linear motor position servo system 525 in feed-forward control.

Even after completion of acceleration of the X stage 561 or wafer top plate 501, the X stage 561 and the Y stage 551 move in accordance with the X position and Y position profiles. After the acceleration, the two Y linear motors and the one X linear motor function only to produce a reaction force of thrust as produced by the fine-motion linear motor (X1, X2, Y1 and Y2).

In accordance with this embodiment as described above, the wafer top plate 501 is accelerated through the X stage 561 and Y stage 551 being moved by linear motors and through the attraction force of the electromagnet 508, taking the X stage 561 as a reference. After acceleration of the wafer top plate 501 is finished, the electric current to the electromagnet is made null to isolate floor vibration. The long-range linear motor position servo system operates to move the X stage 561 and the Y stage 551 in accordance with the X and Y position profiles, in the manner that the electromagnets 508 and the stators or moving elements of the fine-motion linear motor do not contact with each other. In parallel with these operations, high precision position control is performed by using the fine-motion linear motor. By doing so, large thrust and low heat generation as well as high precision six-axis position control to the wafer top plate 501 are accomplished simultaneously.

[Advantages of Independent Measurement and Independent Control]

In this embodiment, the position of the X stage 561 which provides a reference for thrust production by the electromagnets 508 or fine-motion linear motors, is measured completely independently of the position of the wafer top plate 501, and the position control is performed by using a completely independent control system.

Such independent measurement and independent control for the position of the X stage 561 provides significant advantageous results as compared with the control using a relative sensor, such as follows.

First, there is no necessity of using a relative position sensor which may practically cause inconveniences. If a relative position sensor for measuring the relative position of the X stage 561 and the wafer top plate 501 is used, it must be fixed to the X stage 561 or to the wafer top plate 501. If the sensor is to be fixed securely so as to prevent vibration at the sensor mount, the size of the sensor mount becomes large, causing a problem of interference with any other component or increase of mass. Also, a preamplifier has to be mounted near it, causing decrease of space and increase of mass. Further, the X stage 561 or the wafer top plate 501 should carry a cable for the sensor therewith, which results in increased external disturbance factor. By independent measurement and control for the X stage 561 and the wafer top plate 501 in this embodiment, the mass of the top plate 561 can be reduced and, therefore, the response speed as a driving force is applied to the wafer top plate 561 increases. This is effective for high speed positioning of the wafer top plate 501. Further, there is no wiring of sensor cable, which is advantageous for high precision positioning.

Second, the calculation load decreases. This relates to the sensor mounting described above. If relative displacement only in X and Y directions is to be measured by using a relative position sensor such as a gap sensor, it is difficult to place the sensor to perform relative measurement of the position corresponding to the gravity center of the wafer top plate 501, from the X stage 561. For example, in this embodiment, there are electromagnets 508 and magnetic blocks in the neighborhood of the gravity center. The relative position sensor can not be placed there. Then, an Abbe's error attributable to rotation of the wafer top plate 501 is inevitably involved in the relative sensor. In order to remove such error, displacement in X and Y directions has to be calculated from the values wx, wy, wx in the measurement results of the gravity center position of the wafer top plate 501 and from the spacing between the relative position sensor mounting position and the gravity center position of the wafer top plate 501. Also, provision of six relative position sensors is necessary to perform coordinate conversion. This results in enlargement of the calculation load. Since in this embodiment such load to calculation is reduced, which is very advantageous to high speed positioning.

Third, external disturbance to the control system for the X stage 561 and the wafer top plate 501 is reduced. In the control system using relative position sensor, external disturbance involved in the long-range linear motor position servo system is enlarged. In the control system using the relative position sensor, position designation to the long-range linear motor position servo system is always null. If relative displacement between the wafer top plate 501 and the X stage 561 occurs, it leads to external disturbance. Namely, any delay of response of the wafer top plate 510 causes enlargement of external disturbance. Further, in the control method using the relative position sensor, the X-Y stage can not be driven unless the fine-motion LM servo for the wafer top plate 501 is effective. Therefore, in the control method using the relative position sensor, it is not possible to move the X-Y stage position only, for trial, for example. As compared therewith, in accordance with the independent measurement and independent control of this embodiment, the position measurement of the X stage 561 uses an interferometer, and thus only the provision of a mirror on a side face of the X-Y stage 561 is necessary.

In other words, the independent measurement and independent control of this embodiment effectively avoids the necessity of cable wiring and prevents increase of mass resulting from mounting amplifies for the relative position sensor. Further, in the independent measurement and control of this embodiment, rotational amount of the wafer top plate 501 is not mixed into the X and Y position signals as measured by the interferometers. Thus, complicated calculations for the position signal are not necessary. Additionally, any response delay of the wafer top plate 501 is not mixed into the long-range linear motor position servo system, and there is no development of external disturbance. The X stage 561 can be moved to a desired position, by supplying a position signal to the long-range position servo system, without operating the fine-motion linear motor servo system for the wafer top plate.

While this embodiment uses eight fine-motion linear motors for fine-motion control of the wafer top plate in six axes, the number is not limited to it. At least six actuators may be necessary to produce a thrust in six axes. As a matter of course, the placement of the actuators is not limited to that in this embodiment.

Since the electromagnet 508 can produce attraction force only, this embodiment uses four electromagnets 508 for acceleration and deceleration in X and Y directions. However, use of at least three electromagnets allows X and Y driving. As regards the electromagnet 508, any form may be used as long as it can produce an attraction force to a magnetic member in response to application of electric current. The shape is not limited to the E-shaped form as in this embodiment.

In the independent measurement and control of this embodiment, the position measurement to the X stage 561 uses interferometers and mirrors at side faces of the X stage 561. However, in place of such structure, a linear encoder may be provided to the X or Y linear motor, to measure the position of the X stage 561. Alternatively, a sensor means capable of measuring a long distance may be used, in place of such linear encoder.

While this embodiment uses linear motors for moving the X stage in X and Y directions through a long stroke, in place of linear motors, a ball screw, a piston or a robot arm, for example, may be used.

Use of weight compensating spring for supporting the weight of the wafer top plate may be replaced by a floating force by air, repulsion force of magnet or actuators for producing a force in Z direction. The actuator for producing a force in Z direction may use the fine-motion linear motor such as describes above. However, in consideration of heat generation of the linear motor, a small heat generation actuator may be used separately from the fine-motion linear motor.

[Embodiment 5]

Figure 12:
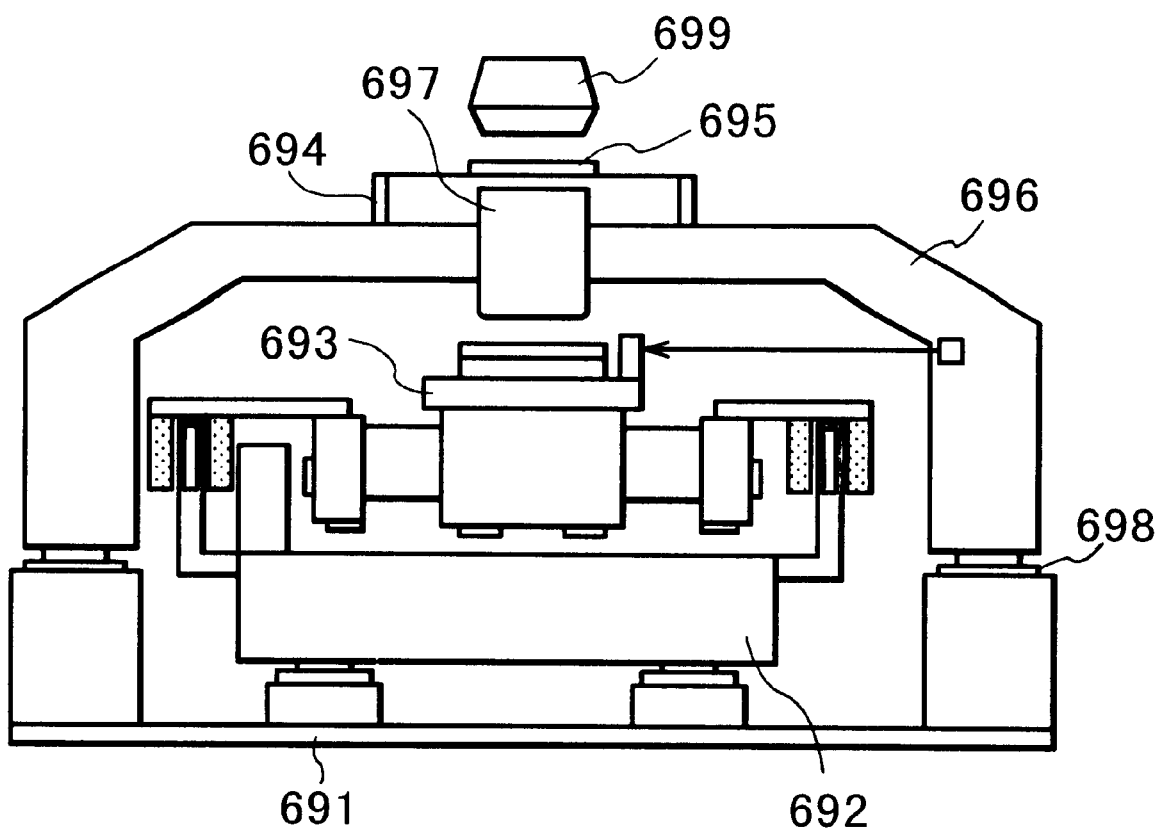
FIG. 12 is a schematic view of an exposure apparatus according to a fifth embodiment of the present invention.

Referring to FIG. 12, an embodiment of scan type exposure apparatus in which a stage system according to any one of the preceding embodiments is incorporated as a wafer stage or a reticle stage, will be explained.

A barrel base 696 is supported by a floor or a base table 691, through dampers 698. The barrel base 696 further supports a reticle stage base 694 as well as a projection optical system 697 which is placed between a reticle stage 695 and a wafer stage 693.

The wafer stage 693 is supported by a stage base which is supported the floor or the base table, and it performs positioning of a wafer placed thereon. The reticle stage 695 is supported by the reticle stage base which is supported by the barrel base 696. The reticle stage is movable while carrying thereon a reticle having a circuit pattern. Exposure light with which a wafer placed on the wafer stage 693 can be exposed to the reticle placed on the reticle stage 695, is supplied from an illumination optical system 699.

The wafer stage 693 is scanned in synchronism with the reticle stage 695. During scan of the reticle stage 695 and the wafer stage 693, the positions of them are continuously detected by means of laser interferometers and the detected positions are fed back to the driving means for the reticle stage 695 and wafer stage 693. With this structure, the scan start positions of these stages can be correctly set in synchronism with each other, and additionally, the scan speed in the constant speed scan region can be controlled precisely. During scan of these stages relative to the projection optical system, the reticle pattern is printed on the wafer, whereby a circuit pattern is transferred to the latter.

In this embodiment, a stage system according to any one of the preceding embodiments is used as the wafer stage or reticle stage, driving the stage with a large thrust still reduces the heat generation. Also, high speed and high precision exposure can be accomplished.

[Embodiment 6]

Next, an embodiment of a semiconductor device manufacturing method which uses an exposure apparatus such as described above, will be explained.

Figure 13:
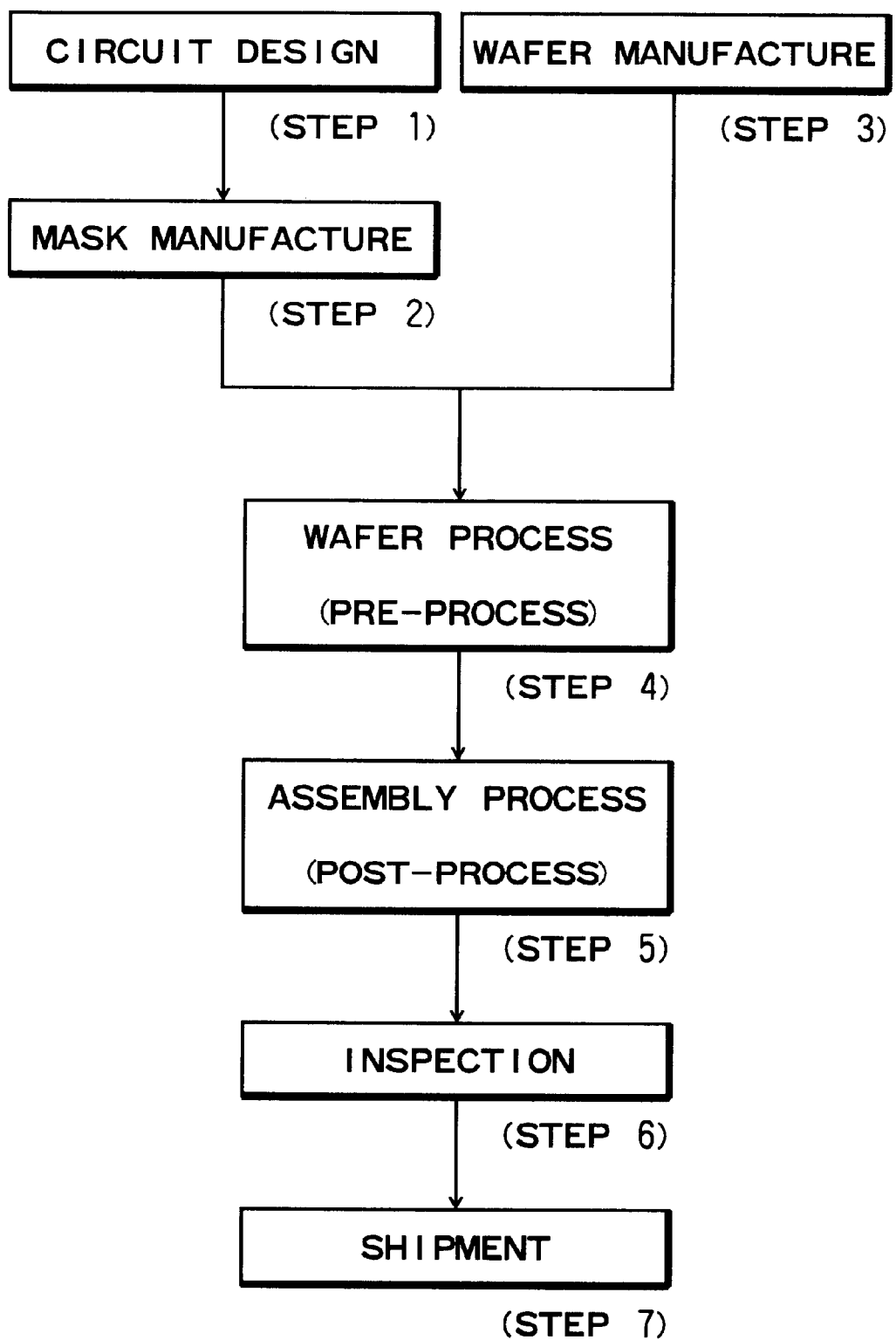
FIG. 13 is a flow chart for explaining semiconductor device manufacturing procedure.

FIG. 13 is a flow chart of procedure for manufacture of microdevices such as semiconductor chips (e.g. ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) process and packaging (chip sealing) process. Step 6 is an inspection step wherein operation check, durability check and so on for the semiconductor devices provided by step 5, are carried out. With these processes, semiconductor devices are completed and they are shipped (step 7).

Figure 14:
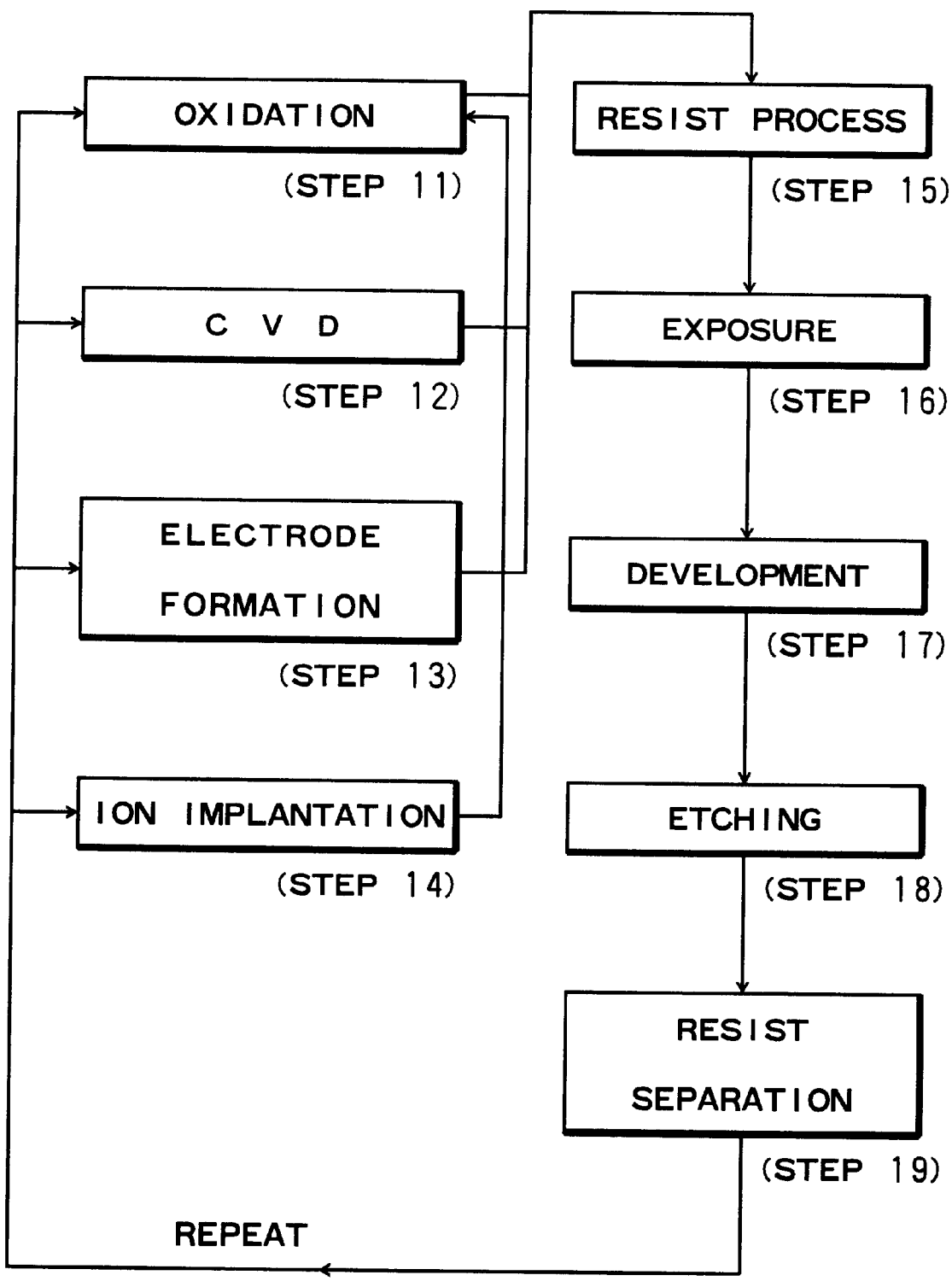
FIG. 14 is a flow chart for explaining a wafer process.
Figure 15A:
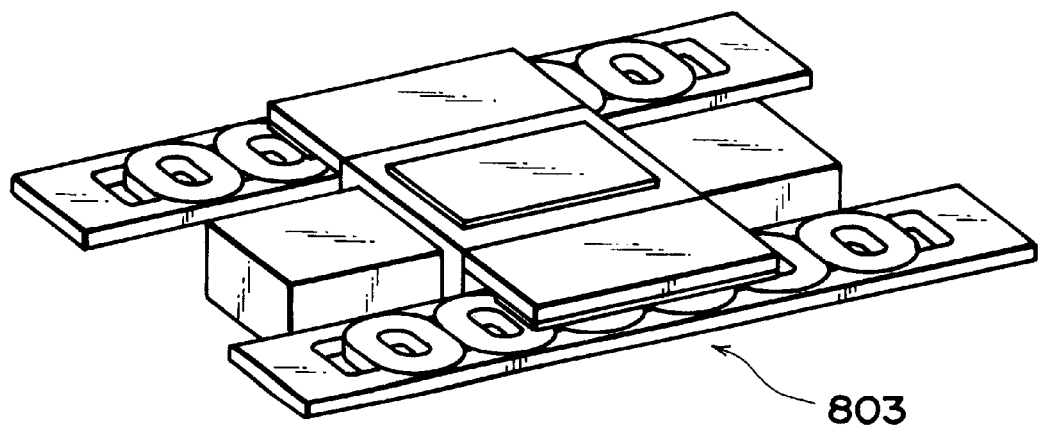
FIGS. 15A, 15B and 16 are schematic views, respectively, for explaining examples of known type stage system.
Figure 15B:
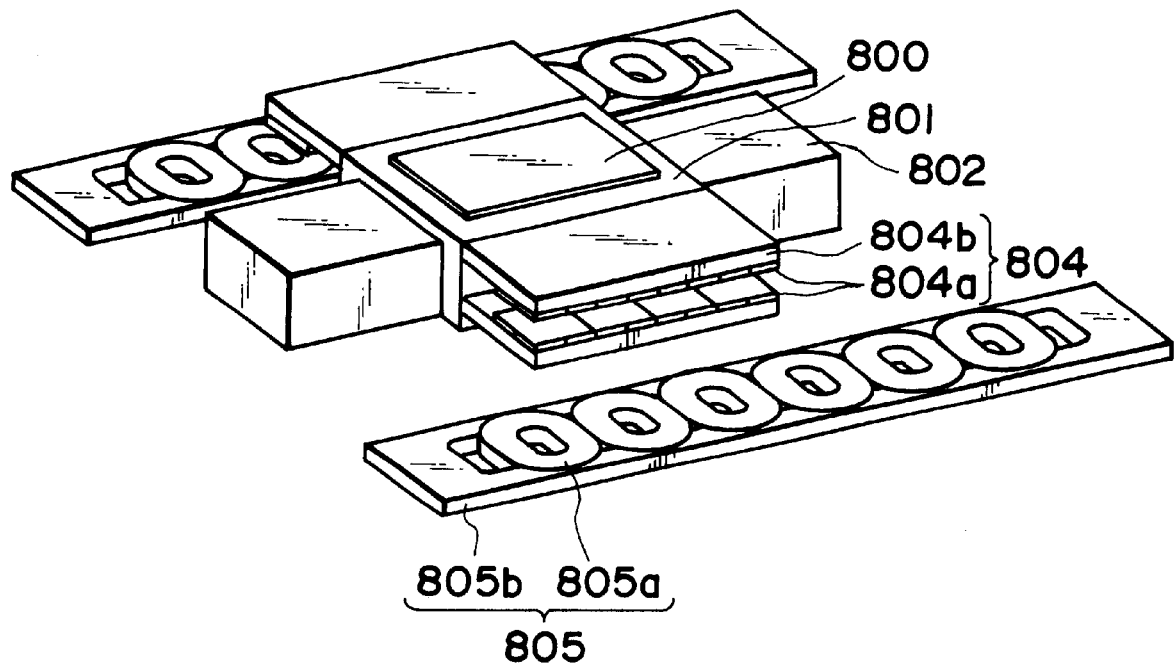
Figure 16:
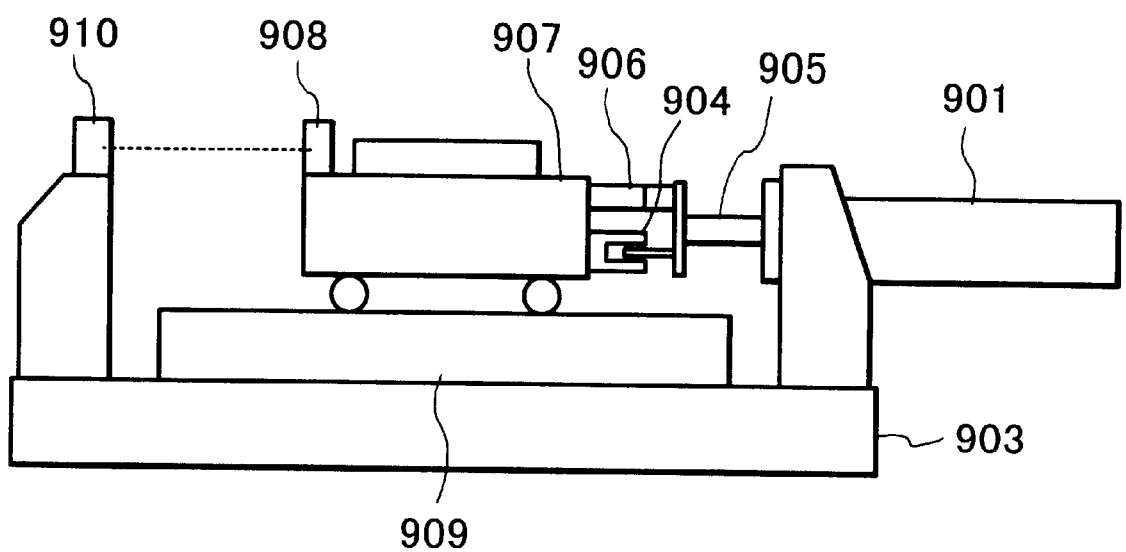

FIG. 14 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:
   a stage being movable in a predetermined direction;
   a first unit for applying a force to the stage in the predetermined direction;
   moving means for moving one of the first unit and a structure including the first unit;
   first measuring means for measuring at lest one of the position and movement amount of the stage; and
   second measuring means for measuring at least one of the position and movement amount of one of the first unit and the structure,
   wherein the stage is controlled on the basis of a measured value of said first measuring means, said moving means is controlled on the basis of a measured value of said second measuring means, and the first unit is controlled on the basis of a measured value of said first measuring means.

2. A stage system, comprising:
a stage being movable in a predetermined direction;
a first unit for applying a force to the stage in the predetermined direction;
moving means for moving one of the first unit and a structure including the first unit;
first measuring means for measuring at lest one of the position and movement amount of the stage; and
second measuring means for measuring at least one of the position and movement amount of one of the first unit and the structure,
wherein the stage is controlled on the basis of a measured value of said first measuring means, said moving means is controlled on the basis of a measured value of said second measuring means, and the first unit is controlled on the basis of information related to a target position of the stage.

3. A stage system, comprising:
a stage being movable in a predetermined direction;
a first unit for applying a force to the stage in the predetermined direction;
moving means for moving one of the first unit and a structure including the first unit;
first measuring means for measuring at lest one of the position and movement amount of the stage; and
second measuring means for measuring at least one of the position and movement amount of one of the first unit and the structure,
wherein the stage is controlled on the basis of a measured value of said first measuring means, said moving means is controlled on the basis of a measured value of said second measuring means, and the first unit includes a linear motor.

4. A stage system, comprising:
a stage being movable in a predetermined direction;
a first unit for applying a force to the stage in the predetermined direction;
moving means for moving one of the first unit and a structure including the first unit;
first measuring means for measuring at lest one of the position and movement amount of the stage; and
second measuring means for measuring at least one of the position and movement amount of one of the first unit and the structure,
wherein the stage is controlled on the basis of a measured value of said first measuring means, said moving means is controlled on the basis of a measured value of said second measuring means, and the first unit has a function for applying a force to a gravity center of the stage.

5. A stage system, comprising:
a stage being movable in a predetermined direction;
a first unit for applying a force to the stage in the predetermined direction;
moving means for moving one of the first unit and a structure including the first unit;
first measuring means for measuring at lest one of the position and movement amount of the stage; and
second measuring means for measuring at least one of the position and movement amount of one of the first unit and the structure,
wherein the stage is controlled on the basis of a measured value of said first measuring means, said moving means is controlled on the basis of a measured value of said second measuring means, and said moving means is controlled on the basis of information related to a target position of the stage.

6. A stage system, comprising:
a stage being movable in a predetermined direction;
a first unit for applying a force to the stage in the predetermined direction;
moving means for moving one of the first unit and a structure including the first unit, wherein said moving means includes one of a linear motor and a ball screw;
first measuring means for measuring at lest one of the position and movement amount of the stage; and
second measuring means for measuring at least one of the position and movement amount of one of the first unit and the structure,
wherein the stage is controlled on the basis of a measured value of said first measuring means, said moving means is controlled on the basis of a measured value of said second measuring means.

7. A stage system, comprising:
a stage being movable in a predetermined direction;
a first unit for applying a force to the stage in the predetermined direction;
moving means for moving one of the first unit and a structure including the first unit;
first measuring means for measuring at lest one of the position and movement amount of the stage; and
second measuring means for measuring at least one of the position and movement amount of one of the first unit and the structure,
wherein the stage is controlled on the basis of a measured value of said first measuring means, said moving means is controlled on the basis of a measured value of said second measuring means, and the stage is movable in three freedom directions.

8. A stage system according to claim 7, wherein the first unit is operable to apply a force to the stage in three freedom directions.

9. A stage system according to claim 7, wherein said moving means is operable to move one of the first unit and the structure in one freedom direction.

10. A stage system, comprising:
a stage being movable in a predetermined direction;
a first unit for applying a force to the stage in the predetermined direction;
moving means for moving one of the first unit and a structure including the first unit;
first measuring means for measuring at lest one of the position and movement amount of the stage; and
second measuring means for measuring at least one of the position and movement amount of one of the first unit and the structure,
wherein the stage is controlled on the basis of a measured value of said first measuring means, said moving means is controlled on the basis of a measured value of said second measuring means, and the stage is movable in six freedom directions.

11. A stage system according to claim 10, wherein the first unit is operable to apply a force to the stage in six freedom directions.

12. A stage system according to claim 10, wherein said moving means comprises an X-Y stage.

13. A stage system, comprising:
a stage being movable in a predetermined direction;
a first unit for applying a force to the stage in the predetermined direction;
a second unit separate from the first unit;
moving means for moving one of the first unit and a structure including the first unit;
first measuring means for measuring at lest one of the position and movement amount of the stage; and
second measuring means for measuring at least one of the position and movement amount of one of the first unit and the structure,
wherein the stage is controlled on the basis of a measured value of said first measuring means, and wherein said moving means is controlled on the basis of a measured value of said second measuring means.

14. A stage system according to claim 13, wherein the second unit is controlled on the basis of information related to a target position of the stage.

15. A stage system according to claim 14, wherein the second unit is feed-forward controlled on the basis of information related to a target position of the stage.

16. A stage system according to claim 14, wherein the information concerns acceleration of the stage.

17. A stage system according to claim 13, wherein the second unit has a function for applying a force to a gravity center of the stage.

18. A stage system according to claim 13, further comprising second moving means for moving one of the second unit and a second structure including the second unit.

19. A stage system according to claim 13, wherein said moving means is operable to move the first and second units integrally.

20. A stage system according to claim 13, wherein the second unit includes an electromagnet.

21. A stage system according to claim 20, wherein the second unit includes at least one set of electromagnets for producing forces opposite to each other and parallel to said predetermined direction.

22. A stage system according to claim 13, wherein the second unit is operable to apply a force to the stage in one freedom direction.

23. A stage system according to claim 13, wherein the second unit is operable to apply a force to the stage in two freedom directions.

24. A stage system, comprising:
a stage being movable in a predetermined direction;
a first unit for applying a force to the stage in a predetermined direction;
a second unit separate from the first unit, for applying a force to the stage in the predetermined direction; and
moving means for moving one of the second unit and a structure including the second unit,
wherein positioning of the stage is performed on the basis of the first unit, acceleration and deceleration of the stage are performed on the basis of the second unit, and the second unit is operable to produce a force larger than that produced by the first unit.

25. A stage system, comprising:
a stage being movable in a predetermined direction;
a first unit for applying a force to the stage in a predetermined direction;
a second unit separate from the first unit, for applying a force to the stage in the predetermined direction; and
moving means for moving one of the second unit and a structure including the second unit,
wherein positioning of the stage is performed on the basis of the first unit, acceleration and deceleration of the stage are performed on the basis of the second unit, and for production of the same driving force, heat generation of the second unit is smaller than that of the first unit.

26. A stage system, comprising:
a stage being movable in a predetermined direction;
a first unit for applying a force to the stage in a predetermined direction;
a second unit separate from the first unit, for applying a force to the stage in the predetermined direction; and
moving means for moving one of the second unit and a structure including the second unit,
wherein positioning of the stage is performed on the basis of the first unit, acceleration and deceleration of the stage are performed on the basis of the second unit, and the first unit is operable to produce an electromagnetic force by use of a coil and a magnet, and wherein the second unit is operable to produce an attraction force by use of a magnetic element and an electromagnet.

27. A stage system according to claim 26, wherein the second unit includes at least one set of electromagnets for producing forces opposite to each other and parallel to said predetermined direction.

28. A stage system, comprising:
a stage being movable in a predetermined direction;
first measuring means for measuring a position of the stage;
a first unit for applying a force to the stage in a predetermined direction;
a second unit separate from the first unit, for applying a force to the stage in the predetermined direction; and
moving means for moving one of the second unit and a structure including the second unit,
wherein positioning of the stage is performed on the basis of the first unit, acceleration and deceleration of the stage are performed on the basis of the second unit.

29. A stage system according to claim 28, wherein the first unit is controlled on the basis of a measured value of said first measuring means.

30. A stage system, comprising:
a stage being movable in a predetermined direction;
a first unit for applying a force to the stage in a predetermined direction;
a second unit separate from the first unit, for applying a force to the stage in the predetermined direction; and
moving means for moving one of the second unit and a structure including the second unit,
wherein positioning of the stage is performed on the basis of the first unit, acceleration and deceleration of the stage are performed on the basis of the second unit, and said moving means is controlled on the basis of a measured value of said second measuring means.

31. A stage system according to claim 30, wherein said moving means is controlled on the basis of a measured value of said second measuring means.

32. A stage system, comprising:
a stage being movable in a predetermined direction;
a first unit for applying a force to the stage in a predetermined direction;
a second unit separate from the first unit, for applying a force to the stage in the predetermined direction; and moving means for moving one of the second unit and a structure including the second unit, wherein positioning of the stage is performed on the basis of the first unit, acceleration and deceleration of the stage are performed on the basis of the second unit, and the second unit has a function for applying a force to the stage throughout a movement stroke of the stage.

33. A stage system, comprising:

a stage being movable in a predetermined direction;

a first unit for applying a force to the stage in a predetermined direction;

a second unit separate from the first unit, for applying a force to the stage in the predetermined direction; and moving means for moving one of the second unit and a structure including the second unit, wherein positioning of the stage is performed on the basis of the first unit, acceleration and deceleration of the stage are performed on the basis of the second unit, and said moving means is operable to move the first and second units integrally.

34. A stage system, comprising:

a stage being movable in a predetermined direction;

a first unit for applying a force to the stage in a predetermined direction;

a second unit separate from the first unit, for applying a force to the stage in the predetermined direction;

moving means for moving one of the second unit and a structure including the second unit, and second moving means for moving one of the first unit and a second structure including the first unit, wherein positioning of the stage is performed on the basis of the first unit, and acceleration and deceleration of the stage are performed on the basis of the second unit.

35. A stage system according to claim 34, further comprising third measuring means for measuring at least one of a position and movement amount of one of the first unit and the second structure including the first unit.

36. A stage system according to claim 35, wherein said second moving means is controlled on the basis of a measured value of said third measuring means.

37. A stage system, comprising:

a stage being movable in a predetermined direction;

a first unit for applying a force to the stage in a predetermined direction, wherein positioning of the stage is performed on the basis of the first unit;

a second unit, separate from the first unit, for applying a force to the stage in the predetermined direction, wherein acceleration and deceleration of the stage are performed on the basis of the second unit;

moving means for moving one of the second unit and a structure including the second unit;

acceleration information producing means for producing a signal related to acceleration of the stage; and positional information producing means for producing a signal related to a position of the stage, wherein the first unit is controlled on the basis of a signal from said positional information producing means, and the second unit is controlled on the basis of a signal from said acceleration information producing means.

38. A stage system according to claim 37, wherein the second unit is feed-forward controlled on the basis of a signal from said acceleration information producing means.

39. A stage system according to claim 37, wherein said moving means is controlled on the basis of a signal from said positional information producing means.

40. A stage system, comprising:

a stage being movable in a predetermined direction;

a first unit for applying a force to the stage in a predetermined direction;

a second unit separate from the first unit, for applying a force to the stage in the predetermined direction; and moving means for moving one of the second unit and a structure including the second unit, wherein positioning of the stage is performed on the basis of the first unit, and acceleration and deceleration of the stage are performed on the basis of the second unit, and the stage is movable in three freedom directions.

41. A stage system according to claim 40, wherein the first unit is operable to apply a force to the stage in three freedom directions.

42. A stage system according to claim 40, wherein the second unit is operable to apply a force to the stage in one freedom direction.

43. A stage system according to claim 40, wherein said moving means is operable to move one of the first unit and the structure including the first unit, in one freedom direction.

44. A stage system, comprising:

a stage being movable in a predetermined direction;

a first unit for applying a force to the stage in a predetermined direction;

a second unit separate from the first unit, for applying a force to the stage in the predetermined direction; and moving means for moving one of the second unit and a structure including the second unit, wherein positioning of the stage is performed on the basis of the first unit, acceleration and deceleration of the stage are performed on the basis of the second unit, and the stage is movable in six freedom directions.

45. A stage system according to claim 44, wherein the first unit is operable to apply a force to the stage in six freedom directions.

46. A stage system according to claim 44, wherein the second unit is operable to apply a force to the stage in two freedom directions.

47. A stage system according to claim 44, wherein said moving means has a function for moving one of the second unit and the structure including the second unit, in two freedom directions.

48. A stage system, comprising:

a stage being movable in a predetermined direction;

a first unit for applying a force to the stage in a predetermined direction;

a second unit, separate from the first unit, for applying a force to the stage in the predetermined direction; and moving means for moving one of the second unit and a structure including the second unit, wherein said moving means comprises an X-Y stage, wherein positioning of the stage is performed on the basis of the first unit, and acceleration and deceleration of the stage are performed on the basis of the second unit.

49. A stage system, comprising:

a stage being movable in a predetermined direction;

a first unit for applying a force to the stage in a predetermined direction;

a second unit separate from the first unit, for applying a force to the stage in the predetermined direction; and moving means for moving one of the second unit and a structure including the second unit, wherein positioning of the stage is performed on the basis of the first unit, acceleration and deceleration of the stage are performed on the basis of the second unit, and the first unit has a function for applying a force to a gravity center of the stage.

50. A stage system, comprising:

a stage being movable in a predetermined direction;

a first unit for applying a force to the stage in a predetermined direction;

a second unit separate from the first unit, for applying a force to the stage in the predetermined direction; and moving means for moving one of the second unit and a structure including the second unit, wherein positioning of the stage is performed on the basis of the first unit, acceleration and deceleration of the stage are performed on the basis of the second unit, and, the second unit has a function for applying a force to a gravity center of the stage.

51. A stage system, comprising:

a stage being movable in a predetermined direction;

a unit for applying a force to the stage in the predetermined direction;

moving means for moving one of the unit and a structure including the unit;

first measuring means for measuring at least one of the position and movement amount of the stage;

second measuring means for measuring at least one of the position and movement amount of one of the unit and the structure; and signal producing means for producing a signal on the basis of a target position of the stage, wherein (i) the unit is controlled on the basis of a signal from said signal producing means and a signal from said first measuring means, (ii) said moving means is controlled on the basis of a signal from said signal producing means and by a signal from said second measuring means, and (iii) the unit is controlled on the basis of a difference between the signal from said signal producing means and a signal from said first measuring means.

52. A stage system, comprising:

a stage being movable in a predetermined direction;

a unit for applying a force to the stage in the predetermined direction;

moving means for moving one of the unit and a structure including the unit;

first measuring means for measuring at least one of the position and movement amount of the stage;

second measuring means for measuring at least one of the position and movement amount of one of the unit and the structure; and signal producing means for producing a signal on the basis of a target position of the stage, wherein (i) the unit is controlled on the basis of a signal from said signal producing means and of a signal from said first measuring means, (ii) said moving means is controlled on the basis of a signal from said signal producing means and of a signal from said second measuring means, and (iii) said moving means is controlled on the basis of a difference between a signal from said signal producing means and a signal from said second measuring means.

53. A stage system, comprising:

a stage being movable in a predetermined direction;

a unit for applying a force to the stage in the predetermined direction;

moving means for moving one of the unit and a structure including the unit;

first measuring means for measuring at least one of the position and movement amount of the stage;

second measuring means for measuring at least one of the position and movement amount of one of the unit and the structure; and signal producing means for producing a signal on the basis of a target position of the stage, wherein (i) the unit is controlled on the basis of a signal from said signal producing means and of a signal from said first measuring means, (ii) said moving means is controlled on the basis of a signal from said signal producing means and of a signal from said second measuring means, and (iii) the signal from said signal producing means relates to the position of the stage.

54. A stage system, comprising:

a stage being movable in a predetermined direction;

a unit for applying a force to the stage in the predetermined direction, wherein the unit includes a linear motor;

moving means for moving one of the unit and a structure including the unit;

first measuring means for measuring at least one of the position and movement amount of the stage;

second measuring means for measuring at least one of the position and movement amount of one of the unit and the structure; and signal producing means for producing a signal on the basis of a target position of the stage, wherein the unit is controlled on the basis of a signal from said signal producing means and of a signal from said first measuring means, and wherein said moving means is controlled on the basis of a signal from said signal producing means and of a signal from said second measuring means.

55. A stage system, comprising:

a stage being movable in a predetermined direction;

a unit for applying a force to the stage in the predetermined direction;

a second unit separate from the unit, for applying a force to the stage;

moving means for moving one of the unit and a structure including the unit;

first measuring means for measuring at least one of the position and movement amount of the stage;

second measuring means for measuring at least one of the position and movement amount of one of the unit and the structure; and signal producing means for producing a signal on the basis of a target position of the stage, wherein the unit is controlled on the basis of a signal from said signal producing means and of a signal from said first measuring means, said moving means is controlled on the basis of a signal from said signal producing means and of a signal from said second measuring means.

56. A stage system according to claim 55, wherein the second unit is feed-forward controlled on the basis of a signal from said signal producing means.

57. A stage system according to claim 55, wherein the second unit can be moved by one of said moving means and second moving means separate from said moving means.

58. A stage system according to claim 55, wherein the second unit includes an electromagnet.

59. A stage system, comprising:

a stage being movable in a predetermined direction; and a unit having a magnetic element and at least one set of electromagnets disposed on the opposite sides of the magnetic element, wherein one of the magnetic element and the electromagnets of the unit is held by the stage, the magnetic element and the electromagnets are kept opposed to each other regardless of rotational motion of the stage, and the magnetic element and the electromagnets have opposed faces having one of a cylindrical shape and a spherical shape.

60. A stage system, comprising:

a stage being movable in a predetermined direction; and a unit having a magnetic element and at least one set of electromagnets disposed on the opposite sides of the magnetic element, wherein one of the magnetic element and the electromagnets of the unit is held by the stage, the magnetic element and the electromagnets are kept opposed to each other regardless of rotational motion of the stage, and the magnetic element has one of an arcuate shape and a cup-like shape.

61. A stage system, comprising:

a stage being movable in a predetermined direction; and a unit having a magnetic element and at least one set of electromagnets disposed on the opposite sides of the magnetic element, wherein one of the magnetic element and the electromagnets of the unit is held by the stage, the magnetic element and the electromagnets are kept opposed to each other regardless of rotational motion of the stage, and the electromagnets have an E-shape.

62. A stage system according to claim 61, wherein an end face of the E-shape electromagnets has one of an arcuate shape and a cup-like shape.

63. A stage system, comprising:

a stage being movable in a predetermined direction; and a unit having a magnetic element and at least one set of electromagnets disposed on the opposite sides of the magnetic element, wherein one of the magnetic element and the electromagnets of the unit is held by the stage, the magnetic element and the electromagnets are kept opposed to each other regardless of rotational motion of the stage, the stage is movable in X and Y directions, and the unit includes at least two sets of electromagnets disposed to sandwich the magnetic element with respect to the X and Y directions.

64. A stage system, comprising:

a stage being movable in a predetermined direction;

a unit having a magnetic element and at least one set of electromagnets disposed on the opposite sides of the magnetic element; and moving means for moving the other of the magnetic element and the electromagnets, not held by the stage, such that the magnetic element and the electromagnets can be held opposed to each other regardless of motion of the stage, wherein one of the magnetic element and the electromagnets of the unit is held by the stage, and the magnetic element and the electromagnets are kept opposed to each other regardless of rotational motion of the stage.

65. A stage system, comprising:

a stage being movable in a predetermined direction; and a unit having a magnetic element and at least one set of electromagnets disposed on the opposite sides of the magnetic element, wherein one of the magnetic element and the electromagnets of the unit is held by the stage, the magnetic element and the electromagnets are kept opposed to each other regardless of rotational motion of the stage, and the magnetic element is disposed on the stage side.

66. A stage system, comprising:

a stage being movable in a predetermined direction; and a unit having a magnetic element and at least one set of electromagnets disposed on the opposite sides of the magnetic element; and adjusting means for adjusting a combined force of the electromagnets to a predetermined level, wherein one of the magnetic element and the electromagnets of the unit is held by the stage, and wherein the magnetic element and the electromagnets are kept opposed to each other regardless of rotational motion of the stage.

67. A stage system, comprising:

a stage being movable in a predetermined direction; and a unit having a magnetic element and at least one set of electromagnets disposed on the opposite sides of the magnetic element, wherein one of the magnetic element and the electromagnets of the unit is held by the stage, the magnetic element and the electromagnets are kept opposed to each other regardless of rotational motion of the stage, and the unit has a function for applying a force to a gravity center of the stage.

68. An exposure apparatus comprising:

a stage system, comprising:

a stage being movable in a predetermined direction;

a first unit for applying a force to the stage in the predetermined direction;

moving means for moving one of the first unit and a structure including the first unit;

first measuring means for measuring at lest one of the position and movement amount of the stage; and second measuring means for measuring at least one of the position and movement amount of one of the first unit and the structure, wherein the stage is controlled on the basis of a measured value of said first measuring means, said moving means is controlled on the basis of a measured value of said second measuring means.

69. An exposure apparatus comprising:

a stage system, comprising:

a stage being movable in a predetermined direction;

a first unit for applying a force to the stage in a predetermined direction;

a second unit separate from the first unit, for applying a force to the stage in the predetermined direction; and moving means for moving one of the second unit and a structure including the second unit, wherein positioning of the stage is performed on the basis of the first unit, and acceleration and deceleration of the stage are performed on the basis of the second unit.

70. An exposure apparatus comprising:
a stage system, comprising:
  a stage being movable in a predetermined direction;
  a unit for applying a force to the stage in the predetermined direction;
  moving means for moving one of the unit and a structure including the unit;
  first measuring means for measuring at least one of the position and movement amount of the stage;
  second measuring means for measuring at least one of the position and movement amount of one of the unit and the structure; and
  signal producing means for producing a signal on the basis of a target position of the stage,
wherein the unit is controlled on the basis of a signal from said signal producing means and of a signal from said first measuring means, and wherein said moving means is controlled on the basis of a signal from said signal producing means and of a signal from said second measuring means.

71. An exposure apparatus comprising:
a stage system, comprising:
  a stage being movable in a predetermined direction; and
  a unit having a magnetic element and at least one set of electromagnets disposed on the opposite sides of the magnetic element,
wherein one of the magnetic element and the electromagnets of the unit is held by the stage, and the magnetic element and the electromagnets are kept opposed to each other regardless of rotational motion of the stage.

72. A device manufacturing method, comprising the steps of:
  preparing an exposure apparatus as recited in claim 68, and
  transferring a reticle pattern to a wafer by use of the exposure apparatus.

73. A device manufacturing method, comprising the steps of:
  preparing an exposure apparatus as recited in claim 69, and
  transferring a reticle pattern to a wafer by use of the exposure apparatus.

74. A device manufacturing method, comprising the steps of:
  preparing an exposure apparatus as recited in claim 70, and
  transferring a reticle pattern to a wafer by use of the exposure apparatus.

75. A device manufacturing method, comprising the steps of:
  preparing an exposure apparatus as recited in claim 71, and
  transferring a reticle pattern to a wafer by use of the exposure apparatus.

76. A stage driving method, comprising:
  a first measuring step for measuring at least one of a position and movement amount of a stage being movable in a predetermined direction;
  a second measuring step for measuring at least one of a position and movement amount of one of a unit having an actuator and a structure including the unit;
  an applying step for applying a force to the stage through the unit;
  a moving step for moving the unit in a predetermined direction through moving means;
  a first control step for controlling the stage on the basis of a first measured value produced in said first measuring step; and
  a second control step for controlling at least one of the position and movement amount of one of the unit and the structure, on the basis of a second measured value produced in said second measuring step, wherein said second control step includes a step for controlling the unit.

77. A method according to claim 76, wherein, in the unit controlling step, the unit is controlled on the basis of the first measured value and a target value.

78. A stage driving method, comprising:
  a first measuring step for measuring at least one of a position and movement amount of a stage being movable in a predetermined direction;
  a second measuring step for measuring at least one of a position and movement amount of one of a unit having an actuator and a structure including the unit;
  an applying step for applying a force to the stage through the unit;
  a moving step for moving the unit in a predetermined direction through moving means;
  a first control step for controlling the stage on the basis of a first measured value produced in said first measuring step;
  a second control step for controlling at least one of the position and movement amount of one of the unit and the structure, on the basis of a second measured value produced in said second measuring step; and
  a second applying step for applying a force to the stage through a second unit separate from the unit.

79. A method according to claim 78, wherein the second unit is feed-forward controlled on the basis of a target value.

80. A stage driving method, comprising:
  a first measuring step for measuring at least one of a position and movement amount of a stage being movable in a predetermined direction;
  a second measuring step for measuring at least one of a position and movement amount of one of a unit having an actuator and a structure including the unit;
  an applying step for applying a force to the stage through the unit;
  a moving step for moving the unit in a predetermined direction through moving means;
  a signal producing step for producing a signal on the basis of a target position of the stage;
  a first control step for controlling the stage on the basis of a first measured value produced in said first measuring step and of a signal produced in said signal producing step;
  a second control step for controlling at least one of the position and movement amount of one of the unit and the structure, on the basis of a second measured value produced in said second measuring step and a signal produced in said signal producing step; and
  detecting a difference between a signal produced in said signal producing step and the first measured value.

81. A stage driving method, comprising:
  a first measuring step for measuring at least one of a position and movement amount of a stage being movable in a predetermined direction;

a second measuring step for measuring at least one of a position and movement amount of one of a unit having an actuator and a structure including the unit;

an applying step for applying a force to the stage through the unit;

a moving step for moving the unit in a predetermined direction through moving means;

a signal producing step for producing a signal on the basis of a target position of the stage;

a first control step for controlling the stage on the basis of a first measured value produced in said first measuring step and of a signal produced in said signal producing step;

a second control step for controlling at least one of the position and movement amount of one of the unit and the structure, on the basis of a second measured value produced in said second measuring step and a signal produced in said signal producing step; and detecting a difference between a signal produced in said signal producing step and the second measured value.

82. A stage assembly, comprising:

a movable stage;

a first unit for applying, to said movable stage, a force for producing movement of said movable stage;

a moving mechanism for moving said first unit, wherein said moving mechanism includes one of a linear motor and a ball screw;

a first measuring system for measuring displacement of said movable stage; and a second measuring system for measuring displacement of said first unit, wherein said movable stage can be positioned on the basis of a measured value of said first measuring system, and wherein said moving mechanism can be positioned on the basis of a measured value of said second measuring system.

83. A stage assembly, comprising:

a movable stage;

a first unit for applying, to said movable stage, a force for producing movement of said movable stage;

a moving mechanism for moving said first unit;

a first measuring system for measuring displacement of said movable stage; and a second measuring system for measuring displacement of said first unit, wherein said movable stage can be positioned on the basis of a measured value of said first measuring system, said moving mechanism can be positioned on the basis of a measured value of said second measuring system, said movable stage is movable in three freedom directions, and said first unit is arranged to apply a force to said movable stage, in three freedom directions.

84. A stage assembly according to claim 83, wherein said moving mechanism is arranged to move one of said first unit and the structure in one freedom direction.

85. A stage assembly, comprising:

a movable stage, wherein said movable stage is movable in six freedom directions;

a first unit for applying, to said movable stage, a force for producing movement of said movable stage;

a moving mechanism for moving said first unit;

a first measuring system for measuring displacement of said movable stage; and a second measuring system for measuring displacement of said first unit;

wherein said movable stage can be positioned on the basis of a measured value of said first measuring system, and said moving mechanism can be positioned on the basis of a measured value of said second measuring system.

86. A stage assembly, comprising:

a movable stage;

a first unit for applying, to said movable stage, a force for producing movement of said movable stage;

a moving mechanism for moving said first unit;

a first measuring system for measuring displacement of said movable stage; and a second measuring system for measuring displacement of said first unit, wherein said movable stage can be positioned on the basis of a measured value of said first measuring system, said moving mechanism can be positioned on the basis of a measured value of said second measuring system, and said first unit is arranged to apply a force to said movable stage, in six freedom directions.

* * * * *

UNITED STATES PATENT AND TRADEMARK OFFICE
CERTIFICATE OF CORRECTION

PATENT NO. : 6,570,645 B2
DATED : May 27, 2003
INVENTOR(S) : Nobushige Korenaga et al.

It is certified that error appears in the above-identified patent and that said Letters Patent is hereby corrected as shown below:

Column 3,
Line 15, "function" should read -- function of --.

Column 9,
Line 17, "null." should read -- null, -- and "The" should read -- the --.

Column 10,
Line 11, "nut I11" should read -- nut 111 --.

Column 12,
Line 40, "-of" should read -- of --.
Line 45, "embodiment." should read -- embodiment, -- and "In" should read -- in --.

Column 14,
Line 11, "direction" should read -- direction. --.

Column 15,
Line 43, "null," should read -- null. --.
Line 48, "designated" should read -- designate --.

Column 19,
Line 7, "327." should read -- 327, -- and "A" should read -- a --.

Column 20,
Line 9, "mas" should read -- may --.
Line 20, "Ib. The" should read -- Ib, the --.

Column 21,
Line 57, "side faces" should read -- side face --.

Column 26,
Line 6, "are are" should read -- are --.

Column 28,
Line 61, "described a" should read -- described --.

Column 30,
Line 61, "motor 51OX" should read -- motor 510X --.

UNITED STATES PATENT AND TRADEMARK OFFICE
CERTIFICATE OF CORRECTION

PATENT NO. : 6,570,645 B2
DATED : May 27, 2003
INVENTOR(S) : Nobushige Korenaga et al.

It is certified that error appears in the above-identified patent and that said Letters Patent is hereby corrected as shown below:

Column 33,
Line 43, "supported" should read -- supported by --.

Column 34,
Line 56, "at lest" should read -- at least --.

Column 35,
Lines 7, 25, 42 and 60, "at lest" should read -- at least --.

Column 36,
Line 13, "at lest" should read -- at least --.
Line 20, "means, said moving" should read -- means, and said moving --.
Lines 29 and 52, "at lest" should read -- at least --.

Column 37,
Line 9, "at lest" should read -- at least --.

Column 38,
Line 40, "acceleration" should read -- and acceleration --.

Column 39,
Line 36, "third measuring means" should read -- third moving means --.

Column 44,
Line 45, "at lest" should read -- at least --.
Line 45, "means, said moving" should read -- means, and said moving --.

Signed and Sealed this

Sixteenth Day of December, 2003

JAMES E. ROGAN
*Director of the United States Patent and Trademark Office*